United States Patent
Lee et al.

(10) Patent No.: US 7,457,897 B1
(45) Date of Patent: Nov. 25, 2008

(54) PCI EXPRESS-COMPATIBLE CONTROLLER AND INTERFACE FOR FLASH MEMORY

(75) Inventors: Charles C. Lee, Sunnyvale, CA (US);
Sun-Teck See, San Jose, CA (US);
Horng-Yee Chou, Palo Alto, CA (US);
I-Pieng Peter Kao, Sunnyvale, CA (US)

(73) Assignee: Suoer Talent Electronics, Inc., San Jose, CA (US)

( * ) Notice: Subject to any disclaimer, the term of this patent is extended or adjusted under 35 U.S.C. 154(b) by 716 days.

(21) Appl. No.: 10/803,597

(22) Filed: Mar. 17, 2004

(51) Int. Cl.
*G06F 3/00* (2006.01)
*G06F 12/00* (2006.01)
*G06F 13/00* (2006.01)

(52) U.S. Cl. .................. 710/74; 710/5; 710/8; 710/9; 710/10; 710/13; 710/72; 710/73; 711/103

(58) Field of Classification Search .............. 710/5, 710/8–10, 13, 72–74; 711/103
See application file for complete search history.

(56) References Cited

U.S. PATENT DOCUMENTS

| 6,839,285 | B2 * | 1/2005 | Zink et al. ............. 365/185.33 |
| 7,130,958 | B2 * | 10/2006 | Chou et al. ................. 711/103 |
| 2004/0233933 | A1 * | 11/2004 | Munguia .................... 370/473 |
| 2005/0258243 | A1 * | 11/2005 | Hsieh .......................... 235/441 |

OTHER PUBLICATIONS

ExpressCard Standard, Release 1.0, published by PCMCIA Association on Dec. 15, 2003, pp. 1-3.
Krig: "PCI Express Provides Enterprise Reliability, Availability, and Serviceability", Intel Corporation, 2003, pp. 1-7.
Inoue et al.: "NAND Flash Applications Design Guide", Toshiba America Electronic Components, Inc., Revision 1.0, Apr. 2003, pp. 1-29.
Miller: "Standard Update: PCI Express And Advanced Switching", Industry Insight, Apr. 2003, RTC, pp. 41-43.
Bhatt: "Creating A Third Generation I/O Interconnect", Intel Developer Network for PCI Express Architecture, pp. 1-11.

* cited by examiner

*Primary Examiner*—Tammara R Peyton
(74) *Attorney, Agent, or Firm*—Bever, Hoffman & Harms, LLP; Jeanette S. Harms

(57) ABSTRACT

A PCI Express-compatible flash device can include one or more flash memory modules, a controller, and an Express-Card interface. The controller can advantageously provide PCI Express functionality as well as flash memory operations, e.g. writing, reading, or erasing, using the ExpressCard interface. A PIO interface includes sending first and second memory request packets to the flash device. The first memory request packet includes a command word setting that prepares the flash device for the desired operation. The second memory request packet triggers the operation and includes a data payload, if needed. A DMA interface includes sending the second memory request from the flash device to the host, thereby triggering the host to release the system bus for the DMA operation.

20 Claims, 18 Drawing Sheets

| | Sub-Command Name | Op Code | R/W | Description |
|---|---|---|---|---|
| 801 | Read Single | 01 h | R | Read single sector |
| 802 | Read Long | 02 h | R | Read sector w/ a spare field |
| 803 | Read Multiple Sectors | 03 h | R | Read sectors using multiple sector setting |
| 804 | Write Single | 11 h | W | Write single sector data |
| 805 | Write Long | 12h | W | Write single sector & ECC data |
| 806 | Write Multiple Sectors | 13 h | W | Write multiple sectors using multiple sector setting |
| 807 | Write Verify | 14 h | W | Write verify by a read after write |

Figure 8A

| | Sub-Command Name | Op Code | R/W | Description |
|---|---|---|---|---|
| 808 | Erase Flash | 1 fh | W | Erase flash by address |
| 809 | Read Attribute | 21 h | R | Read attribute regs |
| 810 | Write Attribute | 31 h | W | Write attribute regs |
| 811 | Reset Device To Idle State | ff h | W | Init target to idle state, no data phase needed |
| 812 | Identify Drive | fe h | R | Requester asks information from flash device |
| 813 | Format | fd h | W | Format flash device |

| Data 820 | Spare Bytes 821 |
|---|---|

Figure 8B

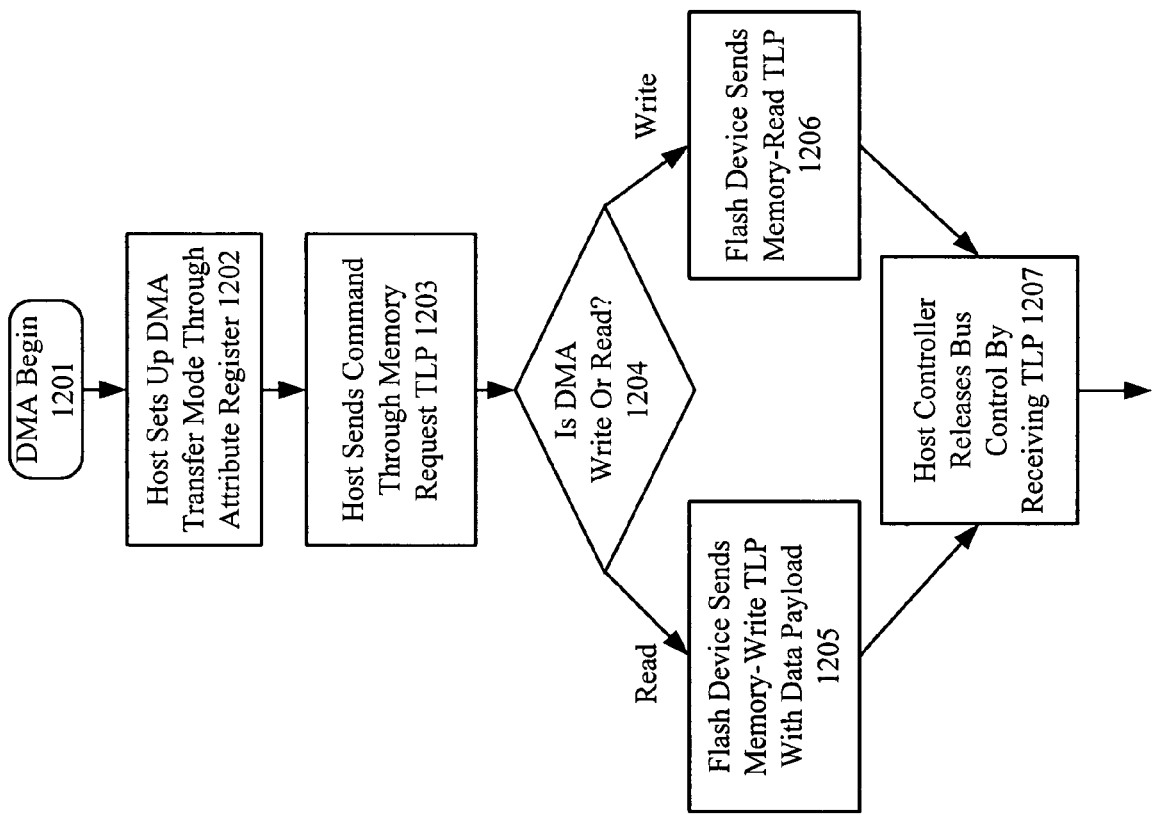

PCI EXPRESS-COMPATIBLE CONTROLLER AND INTERFACE FOR FLASH MEMORY

BACKGROUND OF THE INVENTION

1. Field of the Invention

The present invention is related to semiconductor memory devices, and in particular to providing a controller and an interface that can connect memory modules to a host platform. The controller and interface can advantageously conform to the PCI Express specification.

2. Description of the Related Art

Electrically erasable programmable read only memory (EEPROM) cells can store bit states, i.e. 0's and 1's, even in the event of a power outage. Hence, EEPROM cells are characterized as non-volatile memory devices. In certain configurations, the EEPROM cells in an array can be simultaneously erased, and therefore are also called "flash" memory. Compared to standard hard disks, flash memory is relatively inexpensive and requires relatively little power. Therefore, flash memory is increasingly being used to replace such hard disks in state-of-the-art devices.

An industry standard called the peripheral component interconnect (PCI) has been developed to efficiently use a bus to connect peripherals (e.g. devices including flash memory) to a host platform. Therefore, in some devices, the flash memory is controlled using an input/output (I/O) interface that uses a PCI bus. Unfortunately, this PCI bus can become the slowest link when moving data between a high-speed peripheral device, such as flash memory, and the host platform.

Specifically, the parallel buses used by PCI require a significant number of I/O signal pins. Additionally, these buses require that component, board, and system manufacturers exactly match the propagation delays of a large number of signals and clocks across a system. The degree to which this can be done directly affects the maximum clock rate that can be achieved. To accomplish this matching while maintaining backwards compatibility with regards to voltage swings can impose large power penalties.

To address these disadvantages, another industry standard called PCI Express has recently been jointly developed by Intel Corporation and the PCI Special Interest Group (PCI-SIG). PCI Express is a serial, low voltage, self-clocking I/O transfer methodology, thereby reducing the number of required pins, reducing power, and increasing bandwidth.

In light of this new transfer methodology, a need arises for a controller and an interface compatible with PCI Express that allows flash memory to be efficiently used by a host platform.

SUMMARY OF THE INVENTION

The PCI Express Architecture refers to the next generation I/O interconnect that provides high performance, e.g. bandwidth, using a layered architecture. This layered architecture facilitates optimal serviceability and scalability by ensuring error detection, correction, and reporting in multiple layers.

The PCI Express standard uses a split transaction protocol that includes a request and a completion. In an exemplary transaction, a transaction initiator, i.e. a Requester, transmits a request packet to an intended target, i.e. a Completer. For requests that require completion, the Completer then transmits a completion packet back to the Requester.

The basic unit of communication between PCI Express-compatible devices is a transaction layer packet (TLP). The PCI Express specification defines a TLP as including a header, a data packet, and a digest (i.e. an error correction portion). One or more TLPs can form a transaction that facilitates an operation. Exemplary transactions could facilitate read, write, erase, and status operations. To perform these operations, the PCI Express specification further defines the electrical, i.e. physical, connections between the two PCI Express-compatible devices.

Flash memory is increasingly being used in devices instead of other types of memory because of its low cost and low power requirements. In accordance with one aspect of the invention, a device including flash memory (called a flash device) can communicate with a host platform using a PCI Express-defined bus. Unfortunately, the PCI Express specification is silent on defining a logical interface with a flash device. Therefore, in accordance with another aspect of the invention, the flash device can include an interface (i.e. methodologies, techniques, protocols, etc.) conforming to and expanding upon the PCI Express specification.

For example, in accordance with one aspect of a PCI Express-compatible interface, a host can send a first memory request to the flash device. Of importance, this first memory request can include a header as well as a command word setting, wherein the command word setting indicates the operation to be performed on the flash device. This command word setting can be transmitted in the field normally provided for the data payload. In one embodiment, the header can include a memory mapped I/O address, which could refer to a command word port, a data value port, or a register value port.

If the first memory request is a flash memory write operation, then the host can send a second memory request to the flash device, wherein the second memory request includes a data payload, i.e. the data (or a portion of the data) to be written to the flash device. After receiving the second memory request, the flash device can send a message packet to the host when the write operation is done, wherein the message packet includes a header and a digest to report on a completion status of the write operation.

If the first memory request is a flash memory erase operation, then the host can send a second memory request to the flash device, wherein the second memory request includes a header and a dummy data payload. The dummy data payload includes dummy data to be written to the flash device. After receiving the second memory request, the flash device can send a message packet to the host after erasing is done, wherein the message packet includes a header and a digest to report on a completion status of the erase operation.

If the first memory request is a register write operation, then the host can send a second memory request to the flash device, wherein the second memory request includes a header and a data payload. In this case, the data payload includes data to be written to one or more registers in the flash device. After receiving the second memory request, the flash device can send a message packet to the host. This message packet can include a header and a digest to report on a completion status of the register write operation.

If the first memory request is a memory read operation, then the host can send a second memory request to the flash device, wherein the second memory request includes a header and a digest, but no data payload. After receiving the second memory request, the flash device can send a completion packet to the host if the read operation was successful. In this case, the completion packet can include a header, data from the flash memory, and a digest. If the read operation is not successful or is not yet complete, then the flash device can send a message packet to the host. In this case, the message packet can include a header and a digest to report on a completion status of the read operation.

If the first memory request is a status register read operation, then the host can send a second memory request to the flash device, wherein the second memory request includes a header and a digest, but no data payload. After receiving the second memory request, the flash device can send a completion packet to the host, wherein the completion packet includes a header, data from the status register, and a digest.

If the first memory request is a direct memory access (DMA) operation, then the flash device can send a memory request to the host. For example, if the DMA operation is a write, then the flash device can respond by sending a memory request to the host specifying a memory-read operation. After receiving this memory-read request, a bus controller in the host can release bus control, thereby allowing the requested DMA action to begin. Specifically, the host can retrieve the requested data according to the memory-read request and sends the flash device a completion packet with a data payload. At this point, the flash device can issue a write action and allows the data from the host to be written into the flash memory. If the DMA was successful, then the DMA ends. Otherwise, the process returns to the flash device re-specifying a memory-read operation.

If the DMA operation is a read, then the flash device can respond by sending a memory request to the host specifying a memory-write operation. This memory-write request can include the requested data payload. After receiving this memory-write request, a bus controller in the host can release bus control, thereby allowing the requested DMA action to begin. Specifically, the host controller can write the data payload into the system memory according to the memory-write request. Once complete, the host can send a message back to the flash device reporting on the DMA status. If the DMA was successful, then the DMA ends. Otherwise, the process returns to the flash device re-specifying a memory-write operation.

A flash memory mass storage device is also provided. Advantageously, this flash memory device can include flash memory mappable to a sector-based address space of a logical block address of a host storage system, thereby allowing the host to interact with the flash memory modules of the flash memory device as if the modules were part of the storage system of the host. The flash memory device can further include a PCI Express-defined connector (e.g. an ExpressCard connector) for allowing the host to communicate with the flash memory device as well as a PCI Express-compatible device controller supporting this communication using a command word setting.

The PCI Express-compatible controller can extract transaction layer packets (TLPs) sent from the host via a bus. In one embodiment, this bus supports the PCI Express serial bus protocol. Each TLP includes at least a header and, optionally, a data payload and a digest. Of importance, the field normally reserved for the data payload can provide the command word setting for some memory requests.

The PCI Express-compatible controller can respond to the command word setting. The command word setting can include a command word signature (indicating whether the data payload is one of data and the command word setting), a data unit transfer length, an operation code (designating an operation to be performed on the flash device), a logical block address (indicating a starting location in the flash memory for the operation), and a data transfer length (based on the data unit transfer length).

The operation can include an activity relating directly to the flash memory, e.g. a flash memory read, a flash memory write, and a flash memory erase. The operation could also include an activity related to the flash device, e.g. an attribute register read, an attribute register write, a status register read, or a device reset.

A transaction layer packet (TLP) compatible with PCI Express is also provided. The TLP can include a header field and a data payload field, wherein the data payload field can include a command word setting relating to an operation to be performed on a flash memory.

A flash memory device for connecting to a PCI Express-defined bus is also provided. The flash memory device can include a flash memory module for storing data and a connector for connecting to the PCI Express-defined bus, thereby allowing packets to be transmitted between the PCI Express-defined bus and the flash memory device. Notably, the flash memory device can further include a flash controller for controlling the flash memory module and the connector. In one embodiment, the connector is an ExpressCard connector.

The flash controller can include an analog end unit for performing at least one of serial to parallel signal conversion, differential signaling, and phase locking. The flash controller can further include a physical interface engine for extracting transaction layer packet (TLP) information from a signal output by the analog end unit. This physical interface engine can perform at least one of packet framing/de-framing, 8-bit to 10-bit encoding/decoding, and packet scrambling/descrambling. The flash memory device can further include a command register for receiving the extracted TLP.

BRIEF DESCRIPTION OF THE FIGURES

FIG. 8A illustrates exemplary encoding for various sub-commands and their associated operation codes.

FIG. 8B illustrates an exemplary long read of a sector including data and spare bytes.

FIGS. 12A and 12B illustrate an exemplary DMA operation that can be performed with a flash memory.

DETAILED DESCRIPTION OF THE FIGURES

PCI Express: Overview

PCI Express devices communicate using a split transaction protocol. In a split transaction protocol, a transaction includes a request and a completion. The transaction initiator (called the Requester or host herein) transmits a request to the intended target of the request (called the Completer or flash device herein). For requests that require completion, the Completer later transmits a completion notice to the Requester.

Figure 1A:
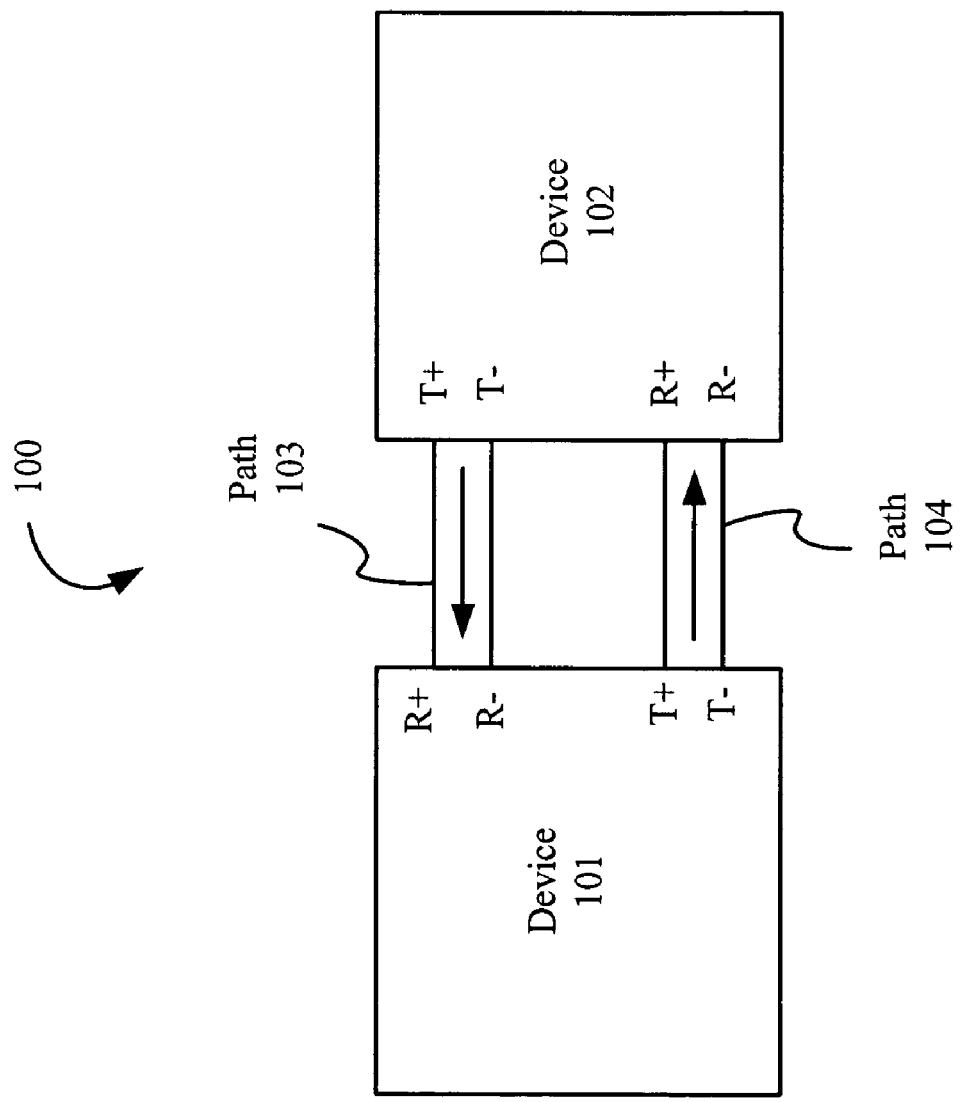
FIG. 1A illustrates a point-to-point connection between two PCI Express devices.

FIG. 1A illustrates a simplified PCI Express system 100 that allows devices 101 and 102 to communicate. To facilitate a point-to-point communication, system 100 can include dual uni-directional paths 103 and 104. Advantageously, these differential, serial paths can allow devices 101 and 102 to communicate simultaneously, thereby effectively doubling each device's bandwidth.

A PCI Express interface can be scaled linearly by adding additional serial paths, thereby increasing the bandwidth of a device. For example, a "×2" configuration would refer to two serial paths to and from a device. The PCI Express specification currently defines ×1 (shown in FIG. 1A), ×2, ×4, ×8, ×12, ×16, and ×32 serial links.

The PCI Express standard provides a virtual channel mechanism that, along with traffic class designations, serves to facilitate traffic flow control in a system. Virtual channels allow independent flow control between different virtual channels. Conceptually, traffic that flows through multiple virtual channels can be multiplexed onto a single physical link, and then de-multiplexed on the receiver side.

System traffic can be characterized using traffic classes. A common analogy compares traffic classes to drivers on a freeway, i.e. carpool drivers, fast drivers, and slow drivers. PCI Express supports up to eight different traffic classes. Each traffic class can be assigned to its own separate virtual channel, which means that there can be at most eight virtual channels. However, unlike drivers on a highway who may continually change lanes, once a transaction is assigned to a traffic class it cannot change to another. After the PCI Express configuration process (which can be performed during a system BIOS routine), the host will know all system end points devices (e.g. all peripheral devices) and their capabilities. Therefore, the operating system (OS) can then assign system resources as well as a traffic class to each end point device, thereby achieving maximum performance during operation.

PCI Express defines the base unit of communication between devices. This base unit is called a transaction layer packet (TLP). One or more TLPs can form the transaction, which can be transmitted/received over a link between the devices. To improve data reliability, the PCI Express architecture can provide certain error detection, error correction, and error reporting protocols across various functional layers of a device.

Figure 1B:
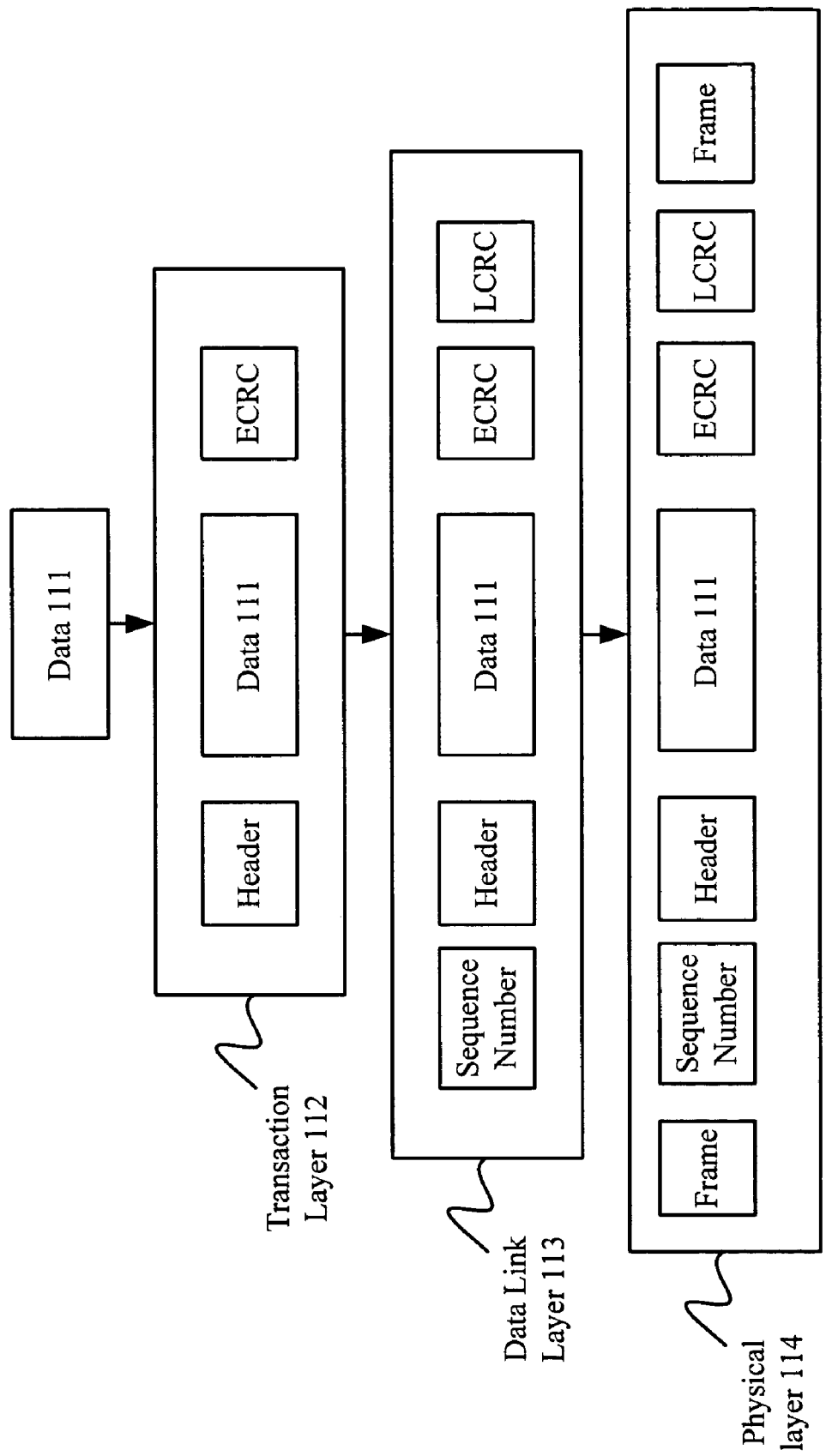
FIG. 1B illustrates three functional layers used in the PCI Express architecture.

FIG. 1B illustrates three functional layers used in the PCI Express architecture. In this architecture, data 111, which is formed in software, can be built into a PCI Express transaction. Specifically, a header and an end-to-end cyclical redundancy check (ECRC) can be added to the data in the transaction layer 112, thereby forming a packet and providing one level of transaction reliability. In a data link layer 113, a sequence number and a 32-bit link cyclical redundancy check (LCRC) can be added, thereby ensuring additional transaction reliability as well as data integrity. (Note that unlike the ECRC, the LCRC can be regenerated during TLP transmission.) In a physical layer 114, frame information can be provided at the front-end and backend to facilitate transmitting/receiving the transaction across the PCI Express link. Physical layer 114 can provide special symbols in the frames to accurately identify and differentiate TLPs. Physical layer 114 can also provide encryption for the transmission of the TLP.

Once a device receives a TLP, each layer of the device can analyze various fields before forwarding the TLP to the next higher layer in the device. For example, after identifying and differentiating a TLP using the frame information (and decoding, as necessary), physical layer 114 can forward the TLP to data link layer 113. Data link layer 113 can detect and correct any protocol errors using the sequence number and the LCRC before forwarding the TLP to transaction layer 112. Transaction layer 112 receives the TLP and checks its ECRC to ensure that the data received can be reliably determined to be data 111 and then pass along the data to a device core (not shown).

Transaction Layer Packet

Figure 2:
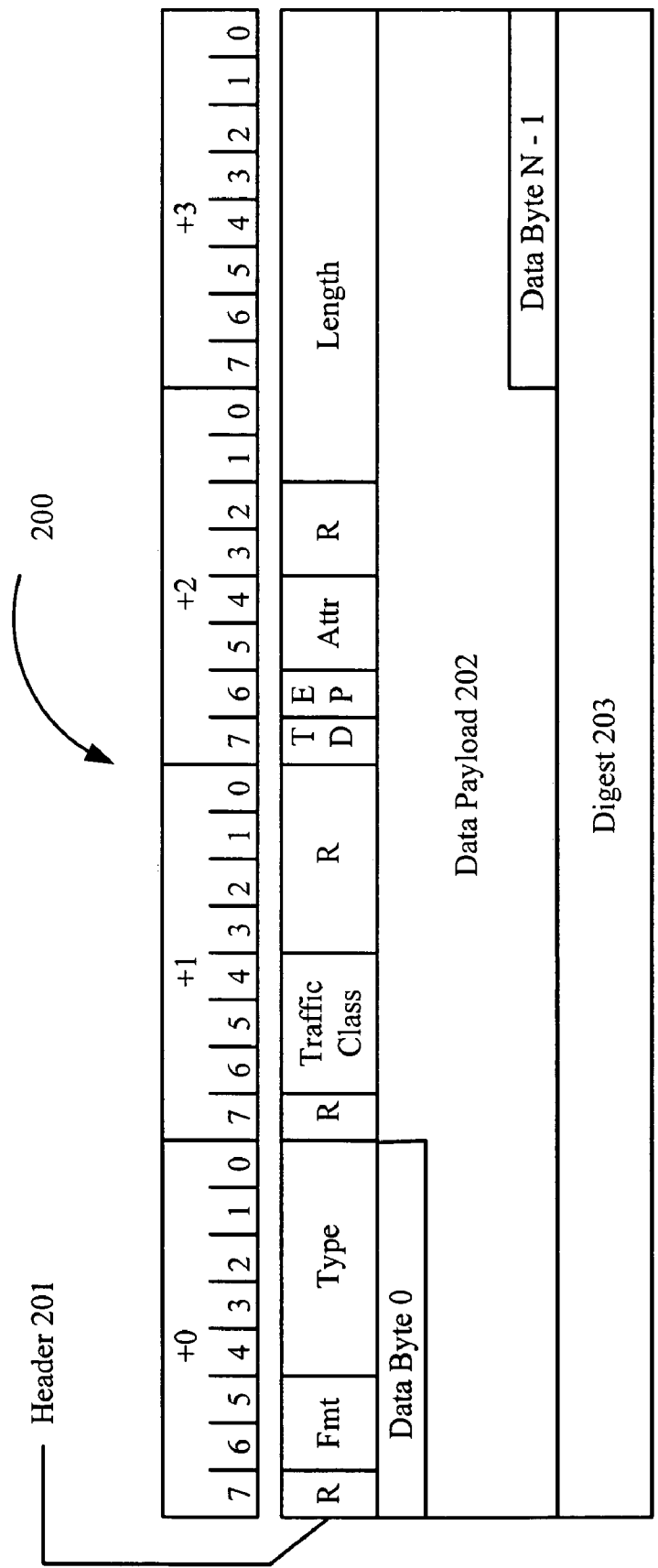
FIG. 2 illustrates a generic transaction layer packet (TLP) including a header, a data payload, and a digest.

As described in reference to FIG. 1B, a transaction layer packet (TLP) generally includes a header, a data payload, and an error checking mechanism (also called a "digest") (e.g. ECRC). FIG. 2 illustrates a generic TLP format 200 in further detail. In format 200, a header 201 is double word (referred to in the industry as a DWord) aligned. In this embodiment, a DWord equals four bytes, i.e. 32 bits. This alignment is indicated by bytes +0, +1, +2, and +3 in the line above header 201.

Note that some types of packets may or may not have a data payload 202 and a digest 203. Therefore, data payload 202 and digest 203 are optional in other embodiments. If data payload 202 is present, then at least the first and last bytes (i.e. data byte 0 and data byte N−1) are also DWord aligned.

Header 201 can advantageously vary in length (e.g. three or four DWords in length) based on the type of transaction. Format 200 shows the first DWord of header 201. In header 201, any field with an "R" indicates a reserved field (generally coded with 0's during TLP formation and ignored by receivers). The format "Fmt" field indicates the format of the TLP. Table 1 shows exemplary two-bit encoding ("b" refers to binary encoding) for various TLP formats.

TABLE 1

Encoding For TLP Formats

| Fmt Encoding (b) | TLP Format |
|---|---|
| 00 | 3 DWord header, no data payload |
| 01 | 4 DWord header, no data payload |
| 10 | 3 DWord header, with data payload |
| 11 | 4 DWord header, with data payload |

The "Type" field in combination with the Fmt field can identify the type of transaction. Table 2 shows exemplary encoding for various TLP types.

TABLE 2

Encoding for TLP Types

| Fmt Encoding | Type Encoding | TLP Type Description |
|---|---|---|
| 00, 01 | 0 0000 | Memory read request (00 = 32 bit address, 01 = 64 bit address) |
| 10, 11 | 0 0000 | Memory write request (10 = 32 bit address, 11 = 64 bit address) |

TABLE 2-continued

Encoding for TLP Types

| Fmt Encoding | Type Encoding | TLP Type Description |
|---|---|---|
| 00 | 0 0100 | Configuration read type 0 |
| 10 | 0 0100 | Configuration write type 0 |
| 01 | 1 0r2r10 | Message request w/ no payload |
| 00 | 0 1010 | Completion w/o data, mem/config write completion |
| 10 | 0 1010 | Completion w/ data, mem/config read completion |

The "Traffic Class" field indicates the traffic class of the packet. By using three bits, 8 traffic classes can be differentiated. Devices can use the bits in the Traffic Class field, along with virtual channel information, to provide different servicing policies.

The "TD" field indicates whether a TLP digest is provided at the end of TLP (e.g. 1=attached and 0=not attached). The "EP" field indicates whether a TLP is "bad", but still forwarded (i.e. allowing for a controlled propagation of an error through the system). The "Attr" field indicates attribute information for the TLP. Attributes can include relaxed ordering and cache coherency, both of which are known to those skilled in the art of PCI and therefore are not further explained.

The "Length" field indicates the length of data payload 202 in DWords. For example, 00 0000 0001b means data payload 202 is one DWord long. The maximum of 1024 DWords can be represented as 00 0000 0000b. Because the first and last bytes of data payload 202, if present, are aligned on a DWord boundary, the total size of the TLP can be determined from the Length, Fmt, and TD fields.

Exemplary TLP headers include memory request headers, configuration headers, message headers, and completion headers. These exemplary headers will now be described.

Memory Request Header

Figure 3:
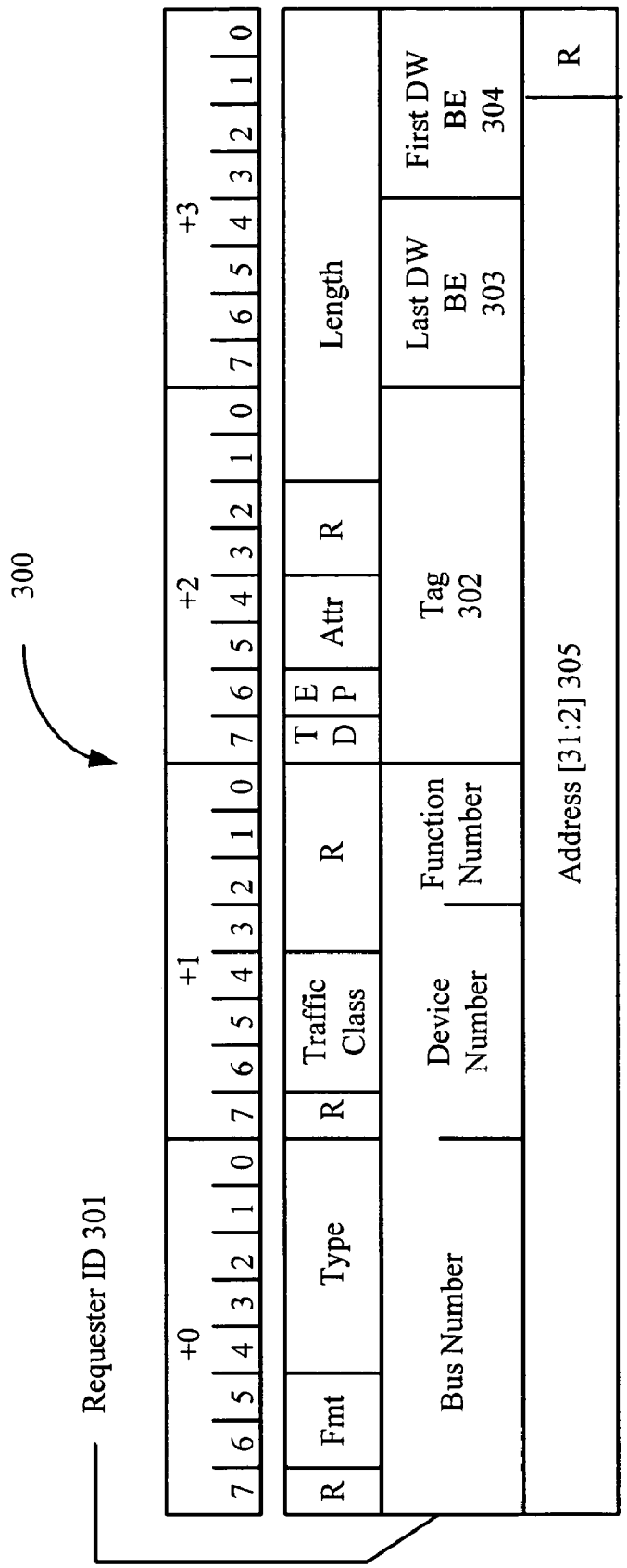
FIG. 3 illustrates a memory request header format for a TLP.

Memory requests can be used to trigger memory reads and memory writes. FIG. 3 illustrates a memory request header format 300. In accordance with PCI Express, the format for the first and second DWords is the same for all memory requests. The first DWord includes fields identical to those described in reference to FIG. 2 (i.e. for header 201). In one embodiment for a 32-bit memory request (and referring back to Table 1), a "00" stored in the Fmt field indicates a memory read, whereas a "10" stored in the Fmt field indicates a memory write.

The second Dword includes a "Requester ID" field 301, a "Tag" field 302, a "Last DW BE" field 303, and a "First DW BE" field 304. Requester ID field 301 includes the bus number, device number, and function number of the Requester. This 16-bit value, which can be assigned during configuration, uniquely identifies the Requester in a root complex (i.e. the root of the connection in the I/O system to the host and the memory).

Tag field 302 can identify the request itself. Specifically, the requester can generate a unique tag for each of its requests requiring a completion. If a completion is required, then the tag and requester ID values can be provided in the associated completion header (described in reference to FIG. 6). In this manner, the completion header ensures that completion information can be efficiently analyzed by the Requester.

"Last DW BE" field 303 and "First DW BE" field 304 contain the byte enables for the last and first Dwords referenced by the memory request TLP. These fields allow the system to complete data transactions even if they are not DWord aligned. In general, the bits of First DW BE field 304 indicate whether bytes 0, 1, 2, 3 should be read/written, whereas the bits of Last DW BE field 303 indicates whether bytes N−4, N−3, N−2, and N−1 should be read/written (e.g. 0=do not read/write, 1=do read/write).

The third DWord includes an "Address" field 305, wherein this address is assigned during the configuration process (and therefore is also called a configuration base address). Advantageously, in accordance with one aspect of the invention, only two base addresses are needed, i.e. a command word port and a sector data port. Of importance, these "ports" are actually memory mapped IO addresses, thereby allowing a PCI Express host to read, write, or erase flash memory as if it were part of the storage system of the host. This memory mapping saves valuable memory space in the host.

Configuration Header

Figure 4:
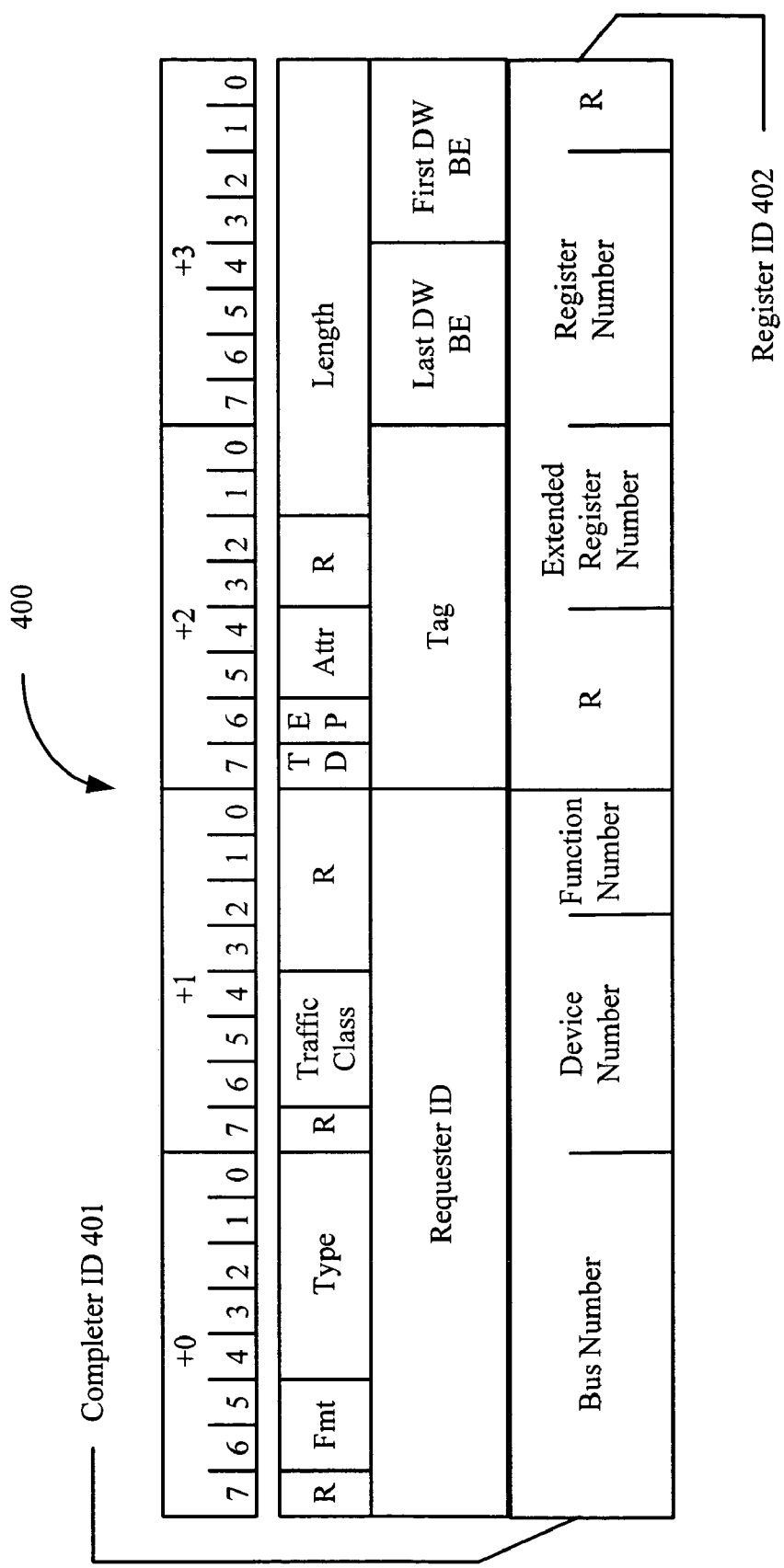
FIG. 4 illustrates a confirmation header format for a TLP.
Figure 11A:
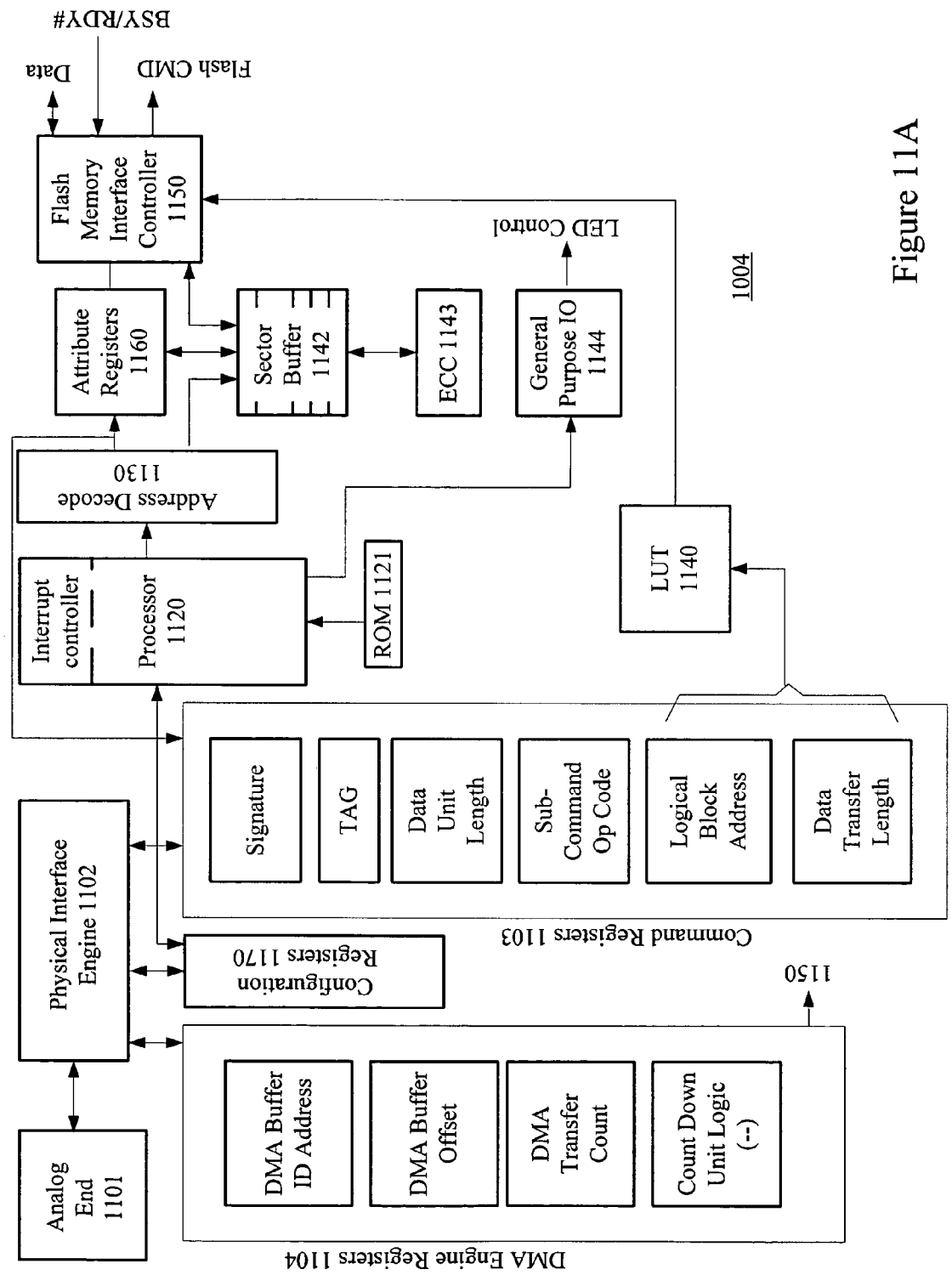
FIG. 11A illustrates an exemplary flash controller that can advantageously conform its operations to PCI Express specifications.

A configuration TLP can be used for a read or write to a configuration register of a device (see also, configuration registers 1170 of FIG. 11A). FIG. 4 illustrates a confirmation header format 400. The first and second DWords include fields identical to those described in reference to FIG. 3.

The third DWord includes a completer ID field 401 and a register ID field 402. Completer ID field 401 includes the bus number, the device number, and the function number of the destination device. Register ID field 402 includes an extended register number and a register number. Therefore, in contrast to a memory request, which is routed using an address (see the third DWord in FIG. 3), a configuration request can be routed using the unique ID of the completion device (the completion ID) and the unique ID of the configuration register within that device (the register ID).

Message Header

Figure 5:
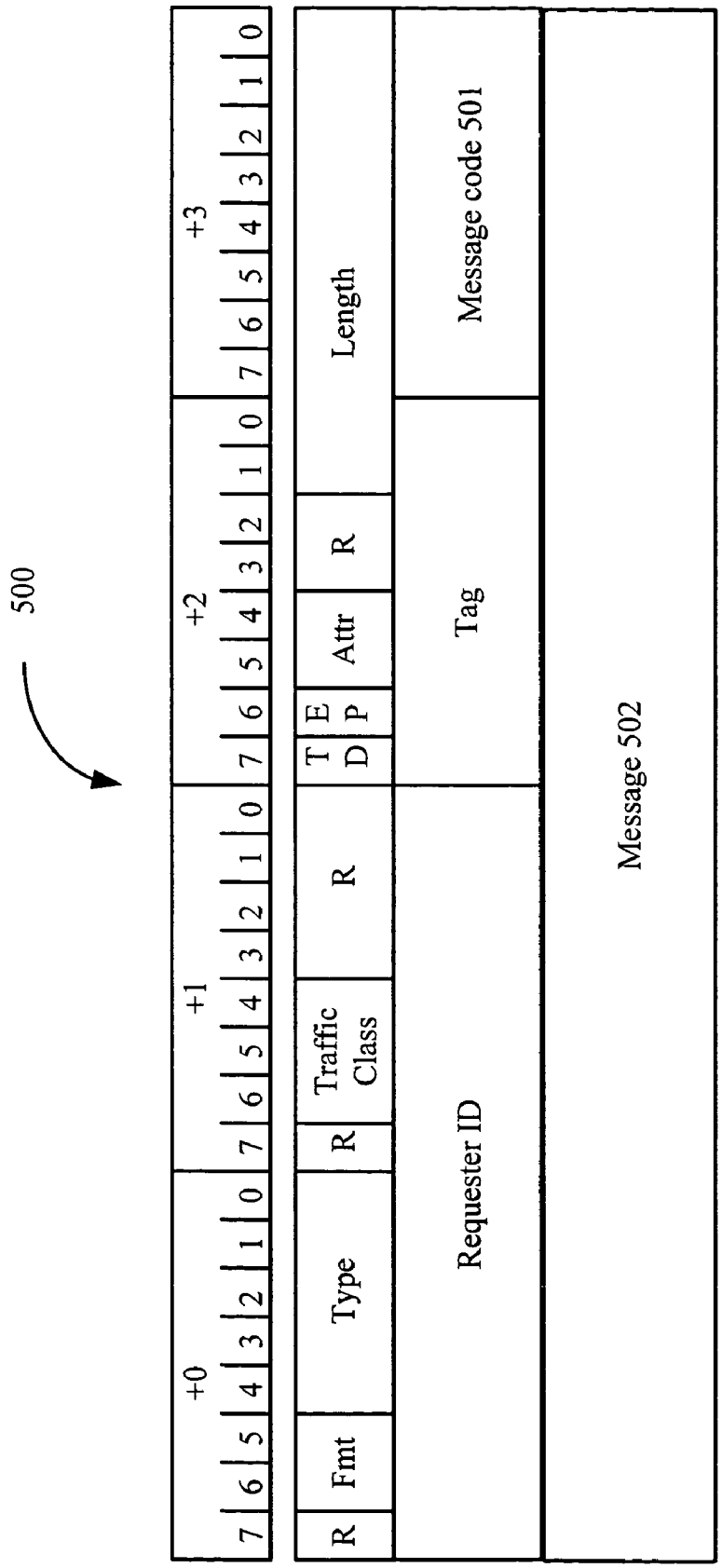
FIG. 5 illustrates a message header format for a TLP.

In PCI Express, signals indicating special events (e.g. interrupt signals, power management, error signals, hot plug signals) are not permitted. However, such special events can be communicated using a message TLP. FIG. 5 illustrates a message header format 500. The first DWord includes fields identical to those described in reference to FIG. 3. The second DWord includes the Requester ID and Tag fields (as described in reference to FIG. 3) as well as a "Message code" field 501, which identifies the type of message provided in "Message" field 502.

Completion Header

Figure 6:
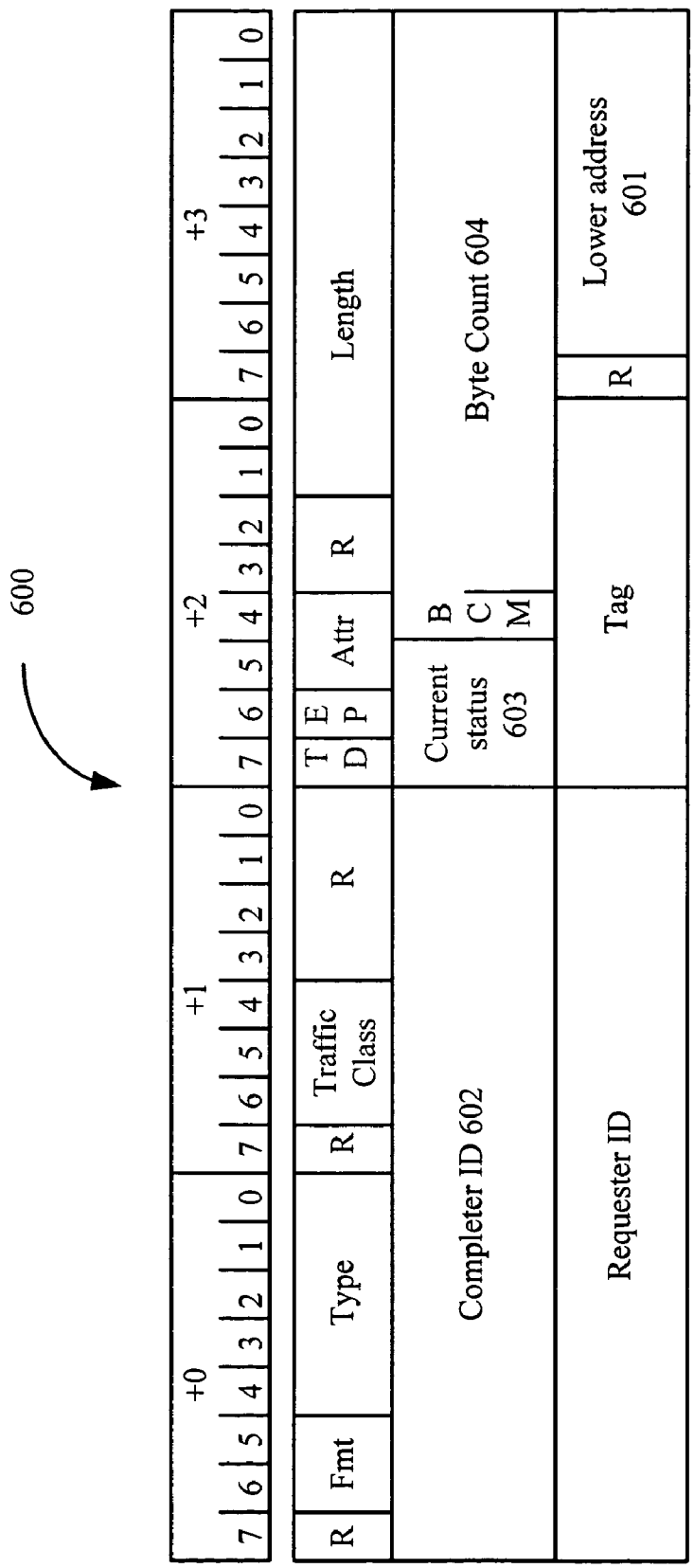
FIG. 6 illustrates a completion header format for a TLP.

Some memory requests, e.g. a memory read, may require a completion packet. FIG. 6 illustrates a completion header format 600. The first DWord includes fields identical to those described in reference to FIG. 3. The third DWord includes the Requester ID and Tag fields (as described in reference to FIG. 3) as well as a "Lower address" field 601. The Lower address refers to the byte address for the first enabled byte of data returned with a memory read completion. The second DWord includes a "Completer ID" field 602, a "Current status" field 603, and a byte count modified (BCM) and "Byte count" field 604.

The Completer ID, which is similar in format to the Requester ID, identifies the completer device. The Current status indicates whether the request has successfully completed. Note that if completion is unsuccessful, then a message packet can be sent to indicate reason for the failure. Exemplary encoding for several completion status responses is provided in Table 3.

TABLE 3

Encoding For Completion Status Responses

| Completion Status Encoding (b) | Status |
| --- | --- |
| 000 | Successful completion |
| 001 | Unsuccessful completion |
| 010 | Configuration request retry status |
| 100 | Completer abort |
| All others | Reserved |

Note that a single memory read request could result in more than one completion packet. In this case, the completion packets, when combined, provide the amount of data originally requested. For this reason, the Byte Count indicates the remaining number of bytes to complete the desired memory read request, thereby allowing the requester to determine if any of the read completion packets are missing. The BCM indicates that the Byte Count may have been modified, i.e. is not being used in its normal manner.

Transaction Phases

In a PCI Express system including a flash device, a transaction can be envisioned as having three phases: a command phase, a data phase, and a status phase. In the command phase, the Requester sends a command that starts an operation (e.g. flash read, flash write, or flash erase as defined in the command). This command is transmitted to a single device endpoint, i.e. the targeted device, based on a destination address in the command. Assuming that this address is valid, then the targeted device, i.e. the Completer, will receive this command and begin the operation designated in the command. As described in further detail below, this command can be sent via a first memory request.

During the subsequent data phase, single or multiple sector data can be transferred between the Requester and the Completer (i.e. from the Requester to the Completer in a write operation or from the Completer to the Requester in a read operation). To trigger this data transfer, the Requester can send a second memory request.

If the data direction is from the Requester to the Completer (i.e. a write operation), then the data to be written to the Completer can be included in the second memory request as its data payload. Depending on the size of the sector to be written, additional memory requests with data payloads may need to be sent to the Completer. On the other hand, if the data direction is from the Completer to the Requester (i.e. a read operation), then the second memory request does not need to include a data payload. Note that if the Completer is unable to fulfill the command of the Requester, then the Completer can ask the Requester to reset and/or resend the command.

Finally, in the status phase, the Completer can send a message or completion packet to the Requester indicating whether the flash operation was successfully performed. If the operation was a flash read, then the completion packet can include a data payload as well as a status (to indicate if the flash read is complete). On the other hand, if the operation was a flash write, then the message packet does not need to include a payload. The message and completion packets include the appropriate tag in the header so that the Requester can pair the received message/completion packet with its issued command.

Command Word Setting

Figure 7:
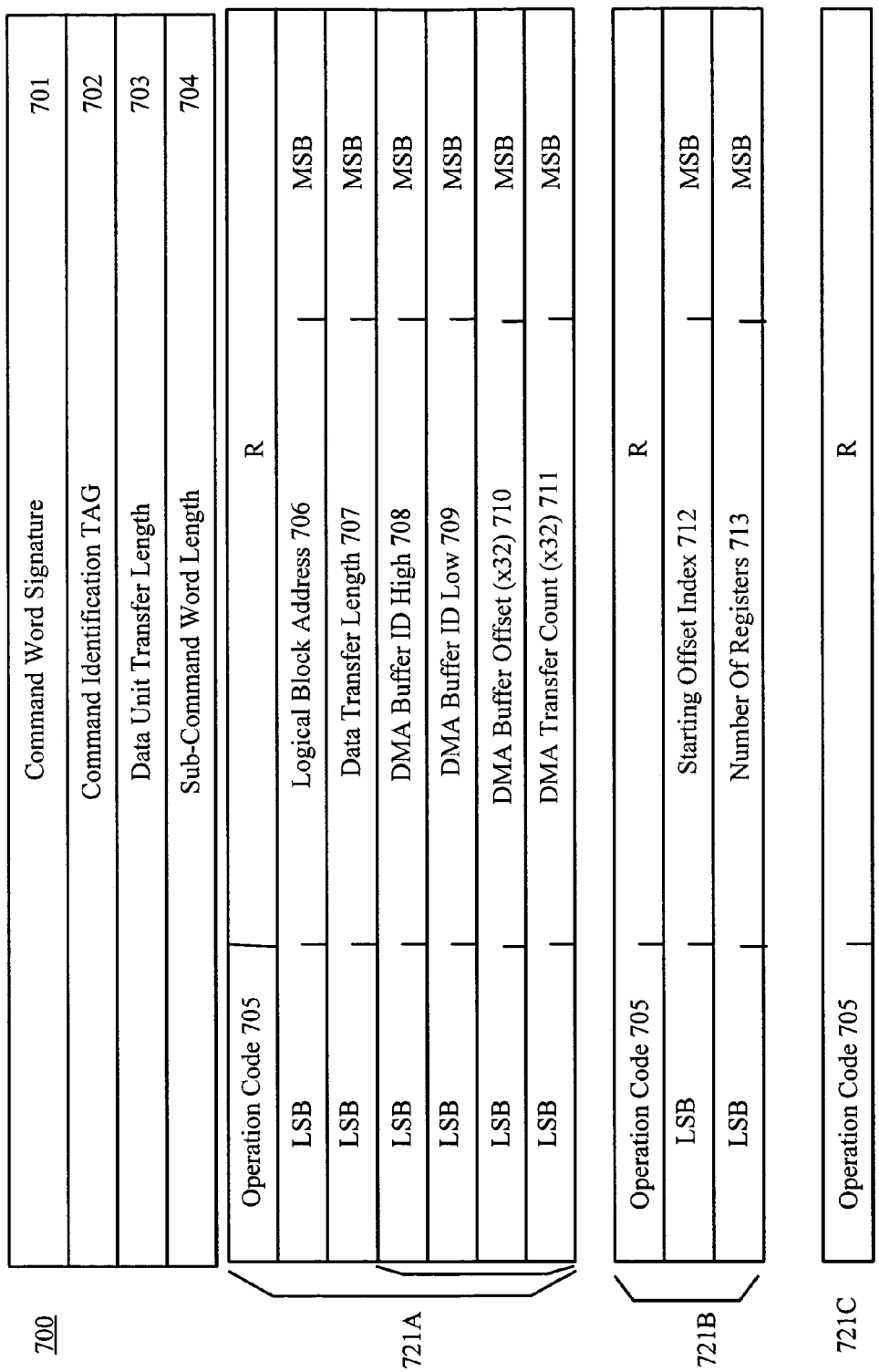
FIG. 7 illustrates an exemplary command word setting for a TLP, wherein the exemplary command word setting can be sent using the data payload field of the TLP.

In accordance with one aspect of a PCI Express interface for a flash device, a first message request TLP can include a command word setting in the field normally reserved for a data payload. FIG. 7 illustrates an exemplary command word setting format 700. This command word setting can be tailored to efficiently address the specific information and functioning of flash memory.

For example, a command word signature field 701 can include predefined values that distinguish between a normal data payload and a command word setting. A command identification TAG field 702 can include a unique identifier for each command word setting. The TAG value can subsequently be included in the corresponding message packet in the tag field (see FIG. 5). A data unit transfer length field 703 can include the sector size defined in the flash memory, thereby indicating the unit for data transfer. In one embodiment, 512 bytes could serve as a default value for sector data transfer as well as register data transfer (discussed in reference to FIG. 8). A sub-command word length field 704 can include the length of the sub-command word, e.g. up to a maximum length of six DWords of sub-command can be set. Specifically, in accordance with one aspect of the invention, various sub-commands can have different lengths and the device should know how long the sub-command is to ensure an accurate response to the sub-command.

For example, command word format 700 can provide one of three detailed sub-command field sets 721A, 721B, or 721C. Sub-command field set 721A indicates a read, write, or erase sector sub-command, programmable I/O (PIO) or direct memory access (DMA); sub-command field set 721B indicates a read or write attribute sub-command; and sub-command field set 721C indicates a format or inquiry sub-command. These sub-commands will now be described in further detail.

In a PIO operation, the host is directly involved in the data transfer of each block. To facilitate this transfer, the read, write, or erase sector sub-command for PIO operations can include an operation code field 705, a logical block address field 706, and a data transfer length field 707. Operation code field 705 can include the sub-command encoding values (described in detail in reference to FIG. 8). Because the operation code has 8 bits (i.e. 1 byte), 256 sub-commands can be identified (i.e. $2^8=256$). In one embodiment, using bits from the adjoining reserved field can increase the number of identifiable sub-commands.

Logical block address (LBA) field 706 can include a starting sector address value for the transferring data. Data transfer length field 707 can include the length of the data transfer, as defined in the units provided in data unit transfer length 703. For example, if the data transfer length is 512 (field 703) and 4096 bytes of data are to be transferred to an LBA X, then X should be in field 706 (the logical block address) and 8 should in field 707 (the data transfer length, 4096/512). In one embodiment, each device can include a single LBA, which serves as a local identifier, and the data transfer length can begin at the start of the block for each transaction.

In a DMA operation, the host can cede control of the transaction to the device. To protect its memory, the host can designate a virtual address (called a buffer) for the device to perform the DMA. This virtual address may include contiguous or non-continuous memory regions within the host. Therefore, to facilitate DMA operations, the read, write, or erase sector sub-command (in addition to fields 705-707) can further include a DMA buffer ID high field 708, a DMA buffer ID low field 709, a DMA buffer offset field 710, and a DMA transfer count field 711.

DMA buffer ID high field 708 and DMA buffer ID low field 709 identify the memory buffer (a concatenated address because of its length) that the flash device will need to access.

These IDs define the virtual address in the host memory. DMA buffer offset field 710 identifies the starting point within the selected buffer where the DMA transfer should begin. DMA transfer count field 711 identifies the length of the DMA transfer.

In accordance with one aspect of the invention, the attribute registers can be local to the flash device and therefore are not accessed using a physical address. Instead, the host can issue an attribute sub-command, wherein the device can then direct the sub-command to the attribute registers. The read or write attribute sub-command can include an operation code field 705, a starting offset index field 712 and a number of registers field 713. Starting offset index field 712 identifies the offset to the first attribute register that will be read/written. Number of registers field 713 identifies the number of attribute registers that will be read/written.

The format/inquiry sub-command can include just the operation code field 705.

FIG. 8A illustrates exemplary encoding for various sub-commands and their associated operation codes (in hexadecimal (h) form), which are usable in operation code field 705. Corresponding explanations as well as SCSI-related commands are provided in FIG. 8A for further clarification on the functionality of the sub-commands.

A read sub-command, e.g. read single sub-command 801, read long sub-command 802, and a read multiple sectors sub-command 803, can indicate a read operation. For example, a read single sub-command refers to an operation that can fetch a single sector of data for the host. A read long sub-command refers to an operation that can fetch a sector of data and the spare field bytes of that sector. FIG. 8B illustrates an exemplary long read for a sector including data 820 and spare bytes 821. The spare bytes could include ECC information, a bad block indicator, a number of erase times for the block, or LBA tracking information after logical to physical translations (which is described in further detail in U.S. patent application Ser. No. 10/789,333, filed on Feb. 26, 2004 by Super Talent Flash Electronics, entitled "System And Method For Controlling Flash Memory", which is incorporated by reference herein). A read multiple sectors sub-command refers to an operation that can fetch multiple sectors of information for the host.

After sending the first request memory TLP that allows the flash device to prepare its firmware, the read operation can be triggered by sending a second TLP having a memory request header (see FIG. 3) with a memory read code, but no data payload. The flash device can respond by transmitting to the host one or more TLPs having completion headers (FIG. 6) and attaching the designated data (or a portion of the data) as a payload. In one embodiment, if the transfer length is greater than 8 sectors, then multiple completion TLPs (each having no more than 8 sectors of information) can be sent to the host. Note that error correction, if necessary, can be performed by the host using the ECRC of the completion TLP.

A write sub-command (e.g. write single sub-command 804, write long sub-command 805, and a write multiple sectors sub-command 806) can indicate a write operation. After sending the first request memory TLP that allows the flash device to prepare its firmware, the write operation can be triggered by sending a second TLP having a memory request header (see FIG. 3) with a memory write code and a data payload. Note that multiple memory requests (e.g. third, fourth, etc. TLPs) may be sent to provide the data for the write operation. For example, in one embodiment, if the data transfer unit (field 703) is defined to be 512 bytes, then the data payload must be aligned with 512 bytes and the maximum data transferred in a packet is limited to 1024 DWords (i.e. 8 sectors×512 bytes). Therefore, any data amount larger than 1024 DWords would require multiple packets. When the write operation is complete, a TLP having a message header (FIG. 5) can be transmitted back to the host. A write verify sub-command 807 can indicate a writer verify operation. In one embodiment, this write verify sub-command is effectively a read operation corresponding to the immediately preceding write operation.

An erase flash sub-command 808 can indicate an erase operation for a block address of the flash memory. After sending the first request memory TLP that allows the flash device to prepare its firmware, the erase operation can be triggered by sending a second TLP having a memory request header (see FIG. 3) with a memory write code and a dummy data payload. The appropriate sub-command, i.e. erase flash 808, is provided in operation code field 705. Because an erase operation can take more time to complete than a write operation, a Busy# pin of the flash memory can be monitored, thereby indicating the status of the erase operation. When the signal on the Busy# pin indicates that the erase operation is complete, a TLP having a message header (FIG. 5) and a message indicating whether the erase was successful can be transmitted to the host.

A read attribute registers sub-command 809 can indicate a read operation of the attribute registers (e.g. registers storing values regarding control information for a sub-command switch). The register(s) to be read can be defined by an offset and a number of registers to be read (see sub-command field set 721B). The read operation of these registers can be triggered by sending a second TLP with a memory request header (see FIG. 3) having a memory read code. The flash device can respond by attaching the designated register values in a TLP with a completion header.

A write attribute registers sub-command 810 can indicate a write operation to the attribute registers of the flash device (or controller). The register(s) to be written to can be defined by the offset and the number of registers to be written (see sub-command field set 721B). After sending the first request memory TLP with the command word setting that allows the flash device to prepare its firmware decisions, the write operation of these registers can be triggered by sending a sending a second TLP with a memory request header (see FIG. 3) having a memory write code and a data payload. In one embodiment, all attribute registers can be written to using this sub-command. When the write attribute register operation is complete, a TLP having a message header (FIG. 5) can be transmitted back to the host as a status report.

A reset device to idle state sub-command 811 can initialize all state machines in the flash device to an idle state. This idle state may be desired when an operation (read, write, or erase) exceeds a specified time-out value. In this case, it may be preferably to stall all operations rather than continue the operation. In one embodiment, this reset drive to idle command can abort the last command and initiate a restart of the flash device.

In one embodiment, the specified time-out value can be set to N×(e.g. 8×) the time set for in the PCI Express specification. If a reset drive to idle command is issued by the flash device, the flash device could also send a TLP with a message header including information regarding the error to the host. Note that the host could also issue the reset drive to idle command if it does not receive a TLP with a message or completion header within a specified time. In one embodiment, if the host does not receive a TLP within the specified time, then the host can abort its last command and then reissue the same command. If this retry is also unsuccessful, then the host can issue the reset drive to idle command.

In one embodiment, reset device to idle state sub-command 811 can also erase all attribute registers in the flash device, thereby allowing the host to recover from errors that cannot be corrected using its firmware.

A format sub-command 813 can be used to format the memory into addressable logical blocks and write predetermined identification information in an area of the flash memory. For example, in one embodiment, the format sub-command can write all 1's to all needed sectors sequentially (thereby creating an erased state). Identification information regarding the flash device can be stored in the reserved area of the memory. In other words, if only a certain portion of the memory is to be used for data, then the remainder of the memory can be designated as a reserved area of the flash memory.

This reserved area can be used for storing certain identification information. This identification information can include memory mapping (also called a master block record (MBR)), wherein a write operation to a block that fails, can result in that block being designated as "bad". Similarly, if an erase operation to a sector fails, then that sector can also be designated as "bad". During subsequent operations involving these bad blocks/sectors, the flash controller can access the reserved area to determine where the next read/write operation should be performed (note that this bad memory mapping creates a virtually contiguous memory space). This memory mapping could be done before the flash device is shipped and/or after use of the flash device that may have resulted in one or more bad blocks/sectors.

Note that this identification information is advantageously written in non-volatile memory, thereby preserving this identification information in the case of inadvertent power outages. In one embodiment, the information stored in the reserved area of the memory can be copied into a LUT in the flash controller, thereby allowing for faster access to this information.

An identify drive sub-command 812 can be sent by the host to the flash device to read the above-described identification information from the flash device. In one embodiment, all identification information stored in the reserved area can be returned to the host. Note that information regarding the reserved area can be stored in the attribute register (e.g. the bad block flag location) and can be altered by a write-attribute command.

Flash Device Technique Using PCI Express

Figure 9A:
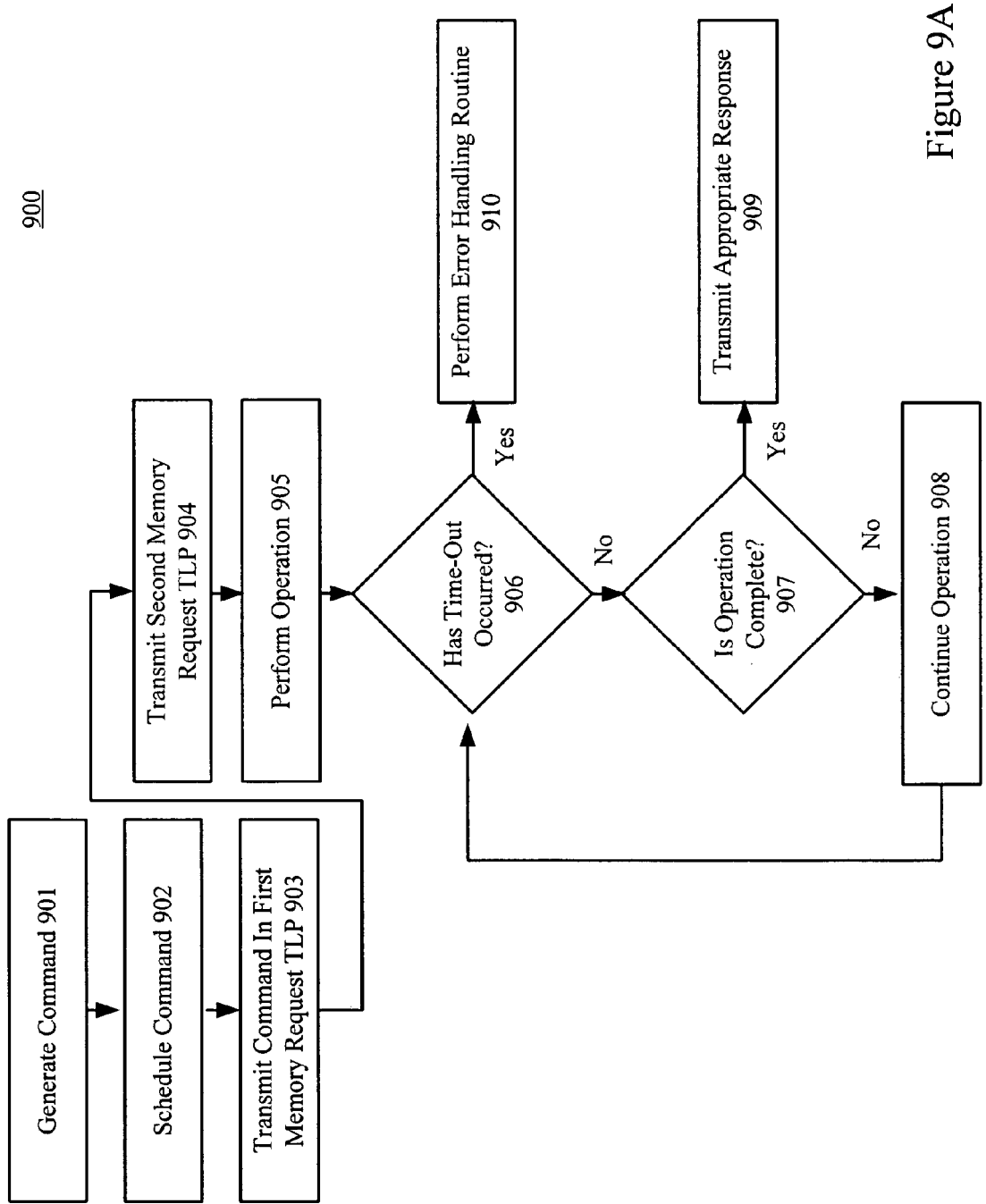
FIG. 9A illustrates an exemplary flow chart for a PCI Express transaction, wherein a device participating in the transaction includes flash memory.

FIG. 9A illustrates an exemplary PIO PCI Exchange interface 900 for use with a flash device. In step 901, the Requester can generate a command to be performed. At this point, the Requester can schedule the command in step 902. In PCI Express, scheduling of commands can include placing each command in a queue based on a traffic class. This scheduling can also include resolving any conflicts between commands, if present.

Once the command is at the front of the queue, a first message request TLP can be sent to the Completer in step 903. Of importance, this first message request TLP can include the command in the data payload field. This command allows the Completer to prepare its firmware to execute the desired operation.

Following transmission of the first memory request TLP, the Requester can send a second memory request TLP in step 904. This second memory request TLP can include a data payload if the desired operation requires such a data payload. In step 905, the Completer can begin the operation specified in the first and second memory request TLPs.

In one embodiment of a PCI Express interface, time-outs can be defined for the operations associated with flash memory. Therefore, if the operation takes longer than that defined for the device in step 906, then a specified error handling routine can be performed in step 910. This error handling routine could be performed by the Completer and/or the Requester. If a time-out has not occurred, then step 907 determines whether the operation is complete. If the operation is not yet complete, then the process returns to step 906. If the operation is complete, then the Completer can transmit the appropriate response to the Requester in step 909.

Exemplary Flash Memory Transactions

In accordance with one aspect of the invention, PCI Express interface 900 can be advantageously tailored to the desired flash memory transaction. Exemplary transactions are now described in further detail.

Flash Write Transaction

Figure 9B:
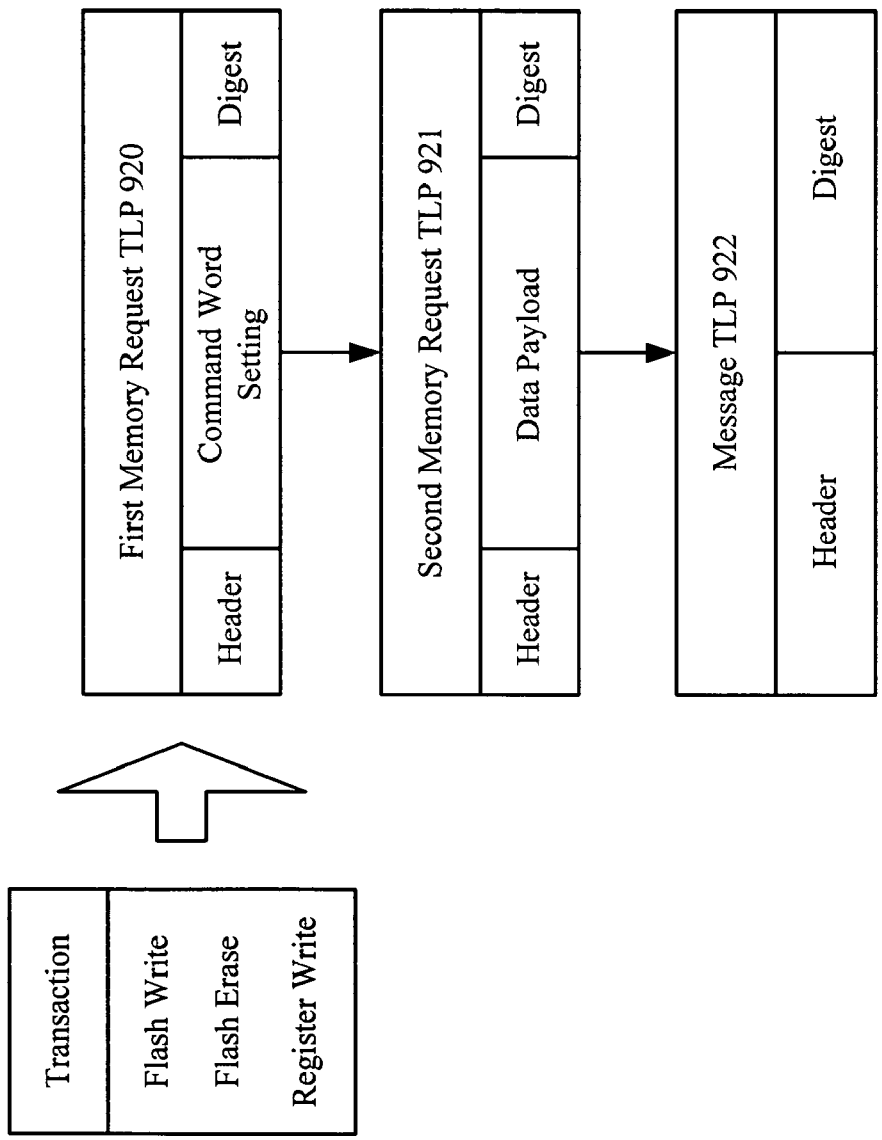
FIG. 9B illustrates exemplary TLPs that can be used for flash write, flash erase, and register write transactions.

Referring to FIG. 9B, in a flash write transaction, the first memory request TLP 920 includes a header (see memory request header format 300 in FIG. 3), which specifies a write operation in the Fmt field (e.g. "10"). The command word setting (provided in the data payload field) (see command word setting format 700 in FIG. 7) specifies the logical block address (field 706) and the transfer length (field 707), thereby indicating the location of the first sector where data should be written as well as how much data should be written. In one embodiment, a digest can also be included. The second memory request TLP 921 includes the same header and digest and further includes the data payload, i.e. the data to be written to the flash memory.

During the write operation (step 905 of FIG. 9A), single or multiple data payloads (sent via one or more memory request TLPs 921) can be sent depending on the length of the total data payload. In one embodiment, the Completer can buffer all received data in a hardware sector first-in-first-out (FIFO) buffer having a length defined in the Command Word Setting, i.e. in Data Unit Transfer Length field 704 (FIG. 7). In one embodiment, a sector FIFO in the Completer can buffer a maximum of 1024 DWords (i.e. 8 sectors) of data.

In one embodiment, the Completer does not send a completion TLP back to the Requester. Instead, the Completer can send the Requester a message TLP 922 (see message format 500 in FIG. 5) indicating the write was successful in step 909 or not successful in step 910. Depending on the message, the Completer can respond by negating the write command (if successful) or re-sending the write command (if not successful).

Flash Erase Transaction

A flash erase transaction is substantially similar to the flash write transaction with the following differences. In the flash erase transaction, the command word setting in the first memory request TLP 920 indicates the location of the first sector where dummy data should be written as well as how much dummy data should be written. The second memory request TLP 921 includes the dummy data payload, which generates the erased block.

During the erase operation, single or multiple dummy data payloads can be sent depending on the length of the total data payload. Typically, no buffering is performed with the dummy data payload.

The Completer can send the Requester a message TLP 922 indicating the erase was successful in step 909 or not successful in step 910. Depending on the message, the Completer can respond by negating the erase command (if successful) or re-sending the erase command (if not successful).

Register Write Transaction

A register write transaction is substantially similar to the flash write transaction with the following differences. In the register write transaction, the command word setting specifies the location of the first register where data should be written to as well as the number of registers that should be written to.

During a typical register write operation (step 905 of FIG. 9A), a single data payload is sent. Completer can send the Requester a message TLP indicating the register write was successful in step 908 or not successful in step 909. Depending on the message, the Completer can respond by negating the register write command (if successful) or re-sending the register write command (if not successful).

Flash Read Transaction

Figure 9C:
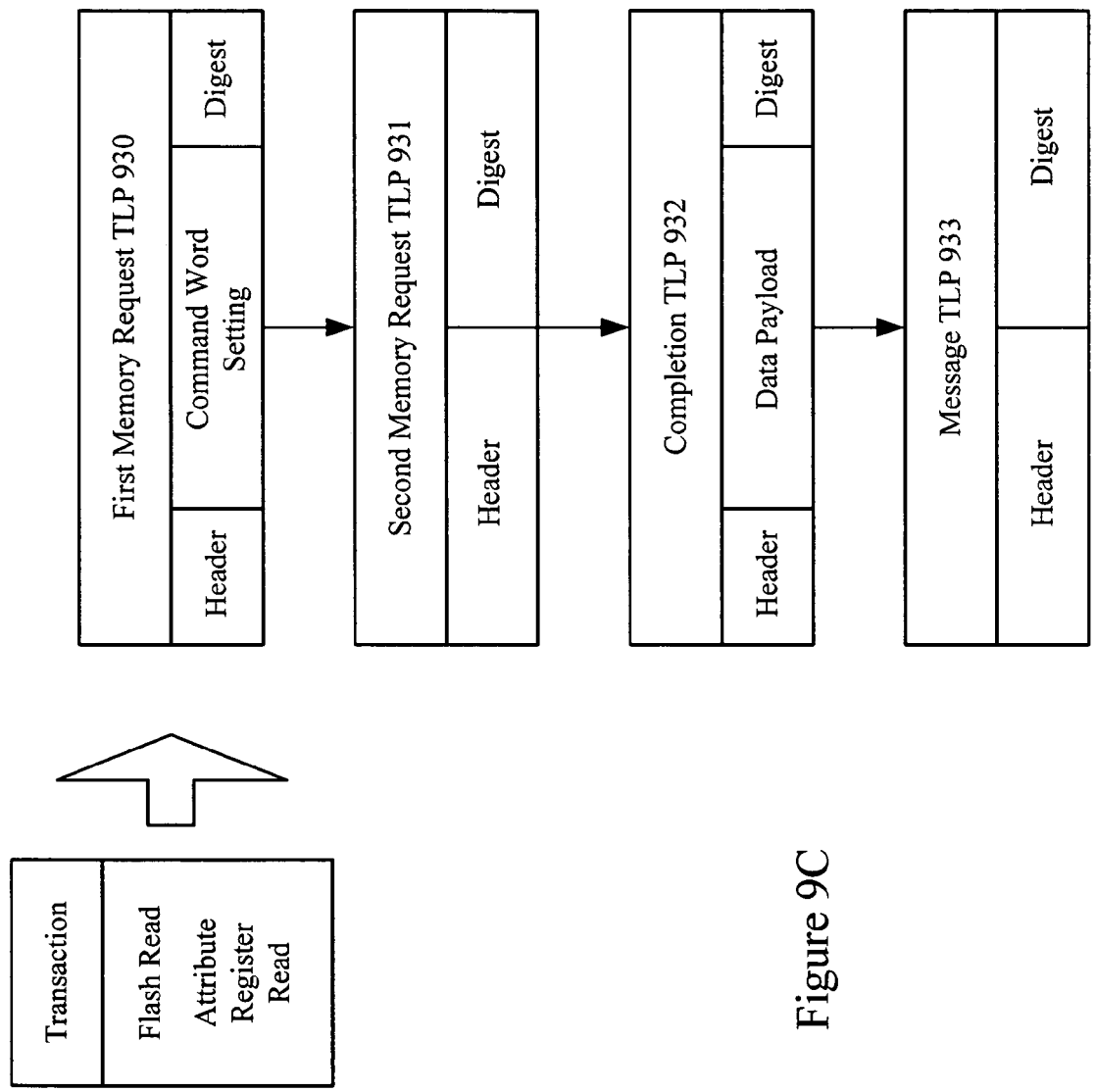
FIG. 9C illustrates exemplary TLPs that can be used for flash read and attribute register read transactions.

Referring to FIG. 9C, in a flash read transaction, the first memory request TLP 930 includes a header (see memory request header format 300 in FIG. 3), which specifies a read operation in the Fmt field (e.g. "00"). The command word setting (provided in the data payload field) (see command word setting format 700 in FIG. 7) specifies the logical block address (field 706) and the transfer length (field 707), thereby indicating the location of the first sector where data should be read as well as how much data should be read. In one embodiment, a digest can also be included. The second memory request TLP 931 includes the same header and digest, but does not include a data payload.

In one embodiment, if the read operation was successful, the Completer can send a completion TLP 932 (see completion header format 600 in FIG. 6) with the requested data as the data payload and the appropriate code in current status field 603 in step 909. In one embodiment, the Requester can be responsible for latching the read data. Note that depending on the amount of data read, a single read command may require multiple completion TLPs 932, (which the Requester can determine by tracking the value in byte count field 604). In one embodiment, if the read operation was not successful, then the Completer can send the Requester a message TLP 933 (see message header format 500 in FIG. 5) with that information in step 910.

Attribute Register Read Transaction

An attribute register read transaction is substantially similar to the flash read transaction with the following differences. In the attribute register read transaction, the command phase of the data payload specifies the location of the first attribute register where data should be read as well as how many attribute registers should be read. If the read operation was successful, the Completer can typically send a single completion TLP 932 with the requested data as the data payload and the appropriate code in current status field 603 in step 909.

Status Register Read Transaction

Figure 9D:
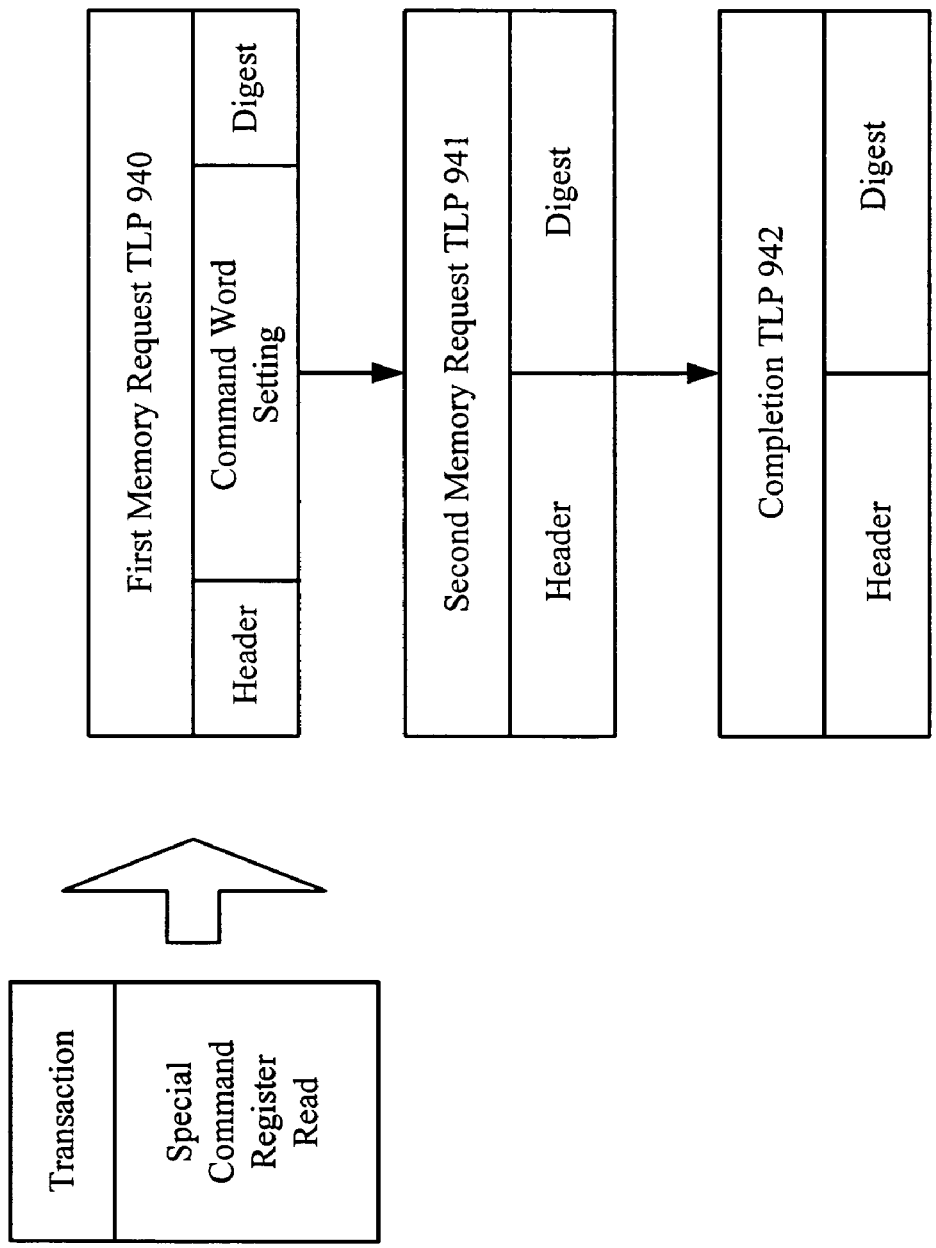
FIG. 9D illustrates exemplary TLPs that can be used for status register read transactions.

Referring to FIG. 9D, in a status register read transaction, the first memory request TLP 940 includes a header (see memory request header format 300 in FIG. 3), which specifies a read operation in the Fmt field (e.g. "00"). Note that the status register (e.g. register 511 of FIG. 11B) can be part of the attribute registers (e.g. attribute registers 1160 in FIG. 11B) in the flash controller. The command word setting (provided in the data payload field) (see command word setting format 700 in FIG. 7) specifies the logical block address (field 706) and the transfer length (field 707), thereby indicating the location of the first register where data should be read as well as how many registers should be read. In one embodiment, a digest can also be included. The second memory request TLP 941 includes the same header and digest, but does not include a data payload.

Irrespective of success, the Completer can send a completion TLP 942 (see completion header format 600 in FIG. 6) with the requested data as the data payload and the appropriate code in current status field 603.

Configuration Read/Write Transactions

During configuration (also called initialization or enumeration in the PCI industry), a flash device can advantageously communicate its type, traffic class, and other necessary information to the host, thereby establishing the link between the flash device and the host and allowing transactions to occur. In one embodiment, the flash device can ask the host during the configuration process to assign configuration base addresses. Of importance, the flash device can ask for as few as two configuration base addresses, thereby saving valuable host memory space. These configuration base addresses include a command word port and a sector data value port. These "ports" are actually memory-mapped IO addresses, thereby allowing the host to perform write, read, and erase operations with the flash memory as if it were part of the storage system of the host. Transactions directly relating to commands use the corresponding command word port; transactions directly relating to flash memory data use the corresponding sector data value port; and transactions directly relating to registers use the corresponding register value port. Table 4 indicates that, in one embodiment, the configuration base address settings can have an address length of 4 DWords.

TABLE 4

Configuration Base Address Settings

| Configuration Base Address Setting, (Memory Mapped IO Address) | Address Length |
|---|---|
| Command Word Port | 4 DWords |
| Sector Data Value Port | 4 DWords |

In one embodiment, each configuration register (e.g. configuration registers 1170 in FIG. 11A) in the flash device can be defined as 32-bit flash memory access, i.e. only occupies one DWord address of total memory addressable space. FIG. 4 illustrates an exemplary configuration header format 400.

PCI Express System Including Flash Device

Figure 10:
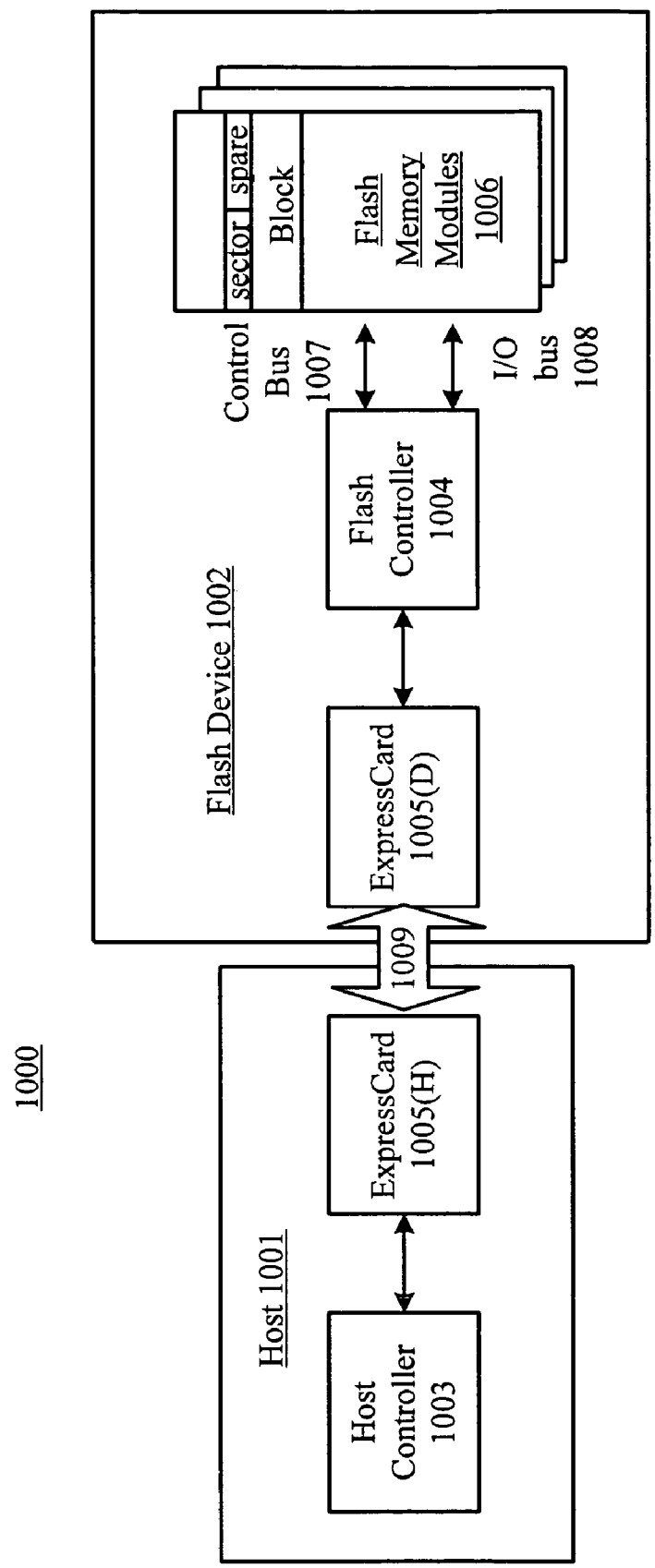
FIG. 10 illustrates an exemplary PCI Express system including a flash device.

FIG. 10 illustrates an exemplary PCI Express system 1000 including a host platform (hereinafter host) 1001, which can interact with a flash device 1002 as a dynamically attachable/detachable, non-volatile memory, mass storage device. Flash device 1002 is connectable to host 1001 through an ExpressCard mating. Specifically, both flash device 1002 and host 1001 can have an ExpressCard-defined mechanical interface 1005 (H=Host, D=Device) that supports a PCI Express-defined logical interface. Note that the ExpressCard interface, which is known to those skilled in the art of PCI, provides a low-cost, easy peripheral expansion that supports transfer rates up to 2.5 Gb/sec, thereby allowing full support for real-time data, voice, audio, and compressed video. The ExpressCard interface also advantageously enables peripheral devices to be dynamically attachable and re-configurable. The ExpressCard Standard, Release 1.0, published by PCMCIA Association on Dec. 15, 2003 discusses such an ExpressCard interface.

In system 1000, both host 1001 and flash device 1002 also include respective controllers. For example, host 1001 can include a host controller 1003, which may be within or outside of a PCI Express Root Complex or a PCI Express switch, for controlling and managing all PCI Express transfers on a PCI Express bus 1009 via ExpressCard interface 1005(H).

Similarly, flash device 1002 can include a flash controller 1004 for controlling and managing all PCI Express transfers on PCI Express bus 1009 via ExpressCard interface 1005(D). In accordance with one aspect of the invention, flash controller 1004 can also advantageously support a PCI Express-compatible interface with flash memory modules 1006. In one embodiment, flash memory modules 1006 can include one or more arrays of flash memory chips in which the data is stored.

In accordance with one aspect of the invention, all communication between host 1001 and flash device 1002 can be made using PCI Express-defined packets or PCI Express-compatible packets transferred through PCI Express data virtual channels. "The Introduction to PCI Express, A Hardware and Software Developer's Guide", by Adam Wilen et al. and published in 2003 by Intel Corporation, describes how these virtual channels can be generated as well as managed and therefore is not discussed in detail herein.

When flash device 1002 is first connected to host 1001, a standard PCI Express configuration process can take place using PCI Express bus 1009. In this process, host 1001 can identify the existence of flash device 1002 and determine the mode of communication to be used with flash device 1002. At this point, host controller 1003 can issue an "identify" sub-command to determine device capacity, type, and other information. Using this information, host controller 1003 can then issue a logical block address capacity limit to flash device 1002.

Additionally, host controller 1003 can assign resources, e.g. configuration base addresses associated with flash device 1002. In one embodiment, flash controller 1004 can ask host 1001 during the configuration process to assign these resources and, to facilitate this assignment, can inform host 1001 how much of these resources are needed. Of importance, flash controller 1004 can ask for as few as three base addresses, thereby saving valuable system memory space. These configuration base addresses include a command word port, a sector data value port, and a register value port. For example, in one embodiment, BIOS could assign a 32-bit address to these ports by writing FFFF,FFFFh to flash device 1002. At this point, logic in flash controller 1004 should return FFFF,FFFCh to tell BIOS that it is a 32-bit address. Flash device 1002 should latch this base address during the configuration process after system resources are assigned to each PCI Express device.

These ports advantageously are memory-mapped IO addresses. Therefore, host controller 1003 can write, read, and erase flash memory modules 1006 as if this flash memory were part of the storage system of host device 1001. Note that this memory mapping technique eliminates the need for an I/O transaction, which is used in a standard PCI Express operation. Flash controller 1004 can use the memory mapped I/O address, which is provided in field 305 (FIG. 3), to identify a command and a sector data transfer.

Flash controller 1004 can also determine the size and manufacturing type of flash memory modules 1006 through sub-command words, i.e. by reading predetermined attribute registers of flash device 1002. At this point, flash controller 1004 can build an identification structure to store this information as well as the translation table. In one embodiment, this translation table can be implemented using a look-up table (LUT). This LUT can comprise standard volatile memory cells, e.g. static random access memory (SRAM) cells. After host controller 1003 identifies flash device 1002 through the PCI Express configuration process, host controller 1003 typically installs a PCI Express client driver accordingly.

Flash controller 1004 controls flash memory module 1006 by using an I/O bus 1008. I/O bus 1008 can transmit the commands for performing read, write, or erase operations on flash memory modules 1006, as well as the addresses and data for these commands (wherein such addresses and data pins are typically defined by the manufacturer of flash memory modules 1006). In one embodiment, flash memory modules 1006 can include a stacked flash memory device, a Single Level Cell (SLC) type of flash memory device, a Multi Level Cell (MLC) type of flash memory device, and a plural mixed types and sizes of flash memory devices.

Flash Controller

FIG. 11A illustrates a simplified, exemplary flash controller 1004 that can provide preliminary processing of the signals received by ExpressCard interface 1005(D). This processing, performed by an analog end 1101, can include serial to parallel signal conversion (and vice versa), differential signaling, and phase locking for providing the clocks needed during encoding. A physical interface engine 1102 can extract TLP information from such processed signals. In one embodiment, physical interface engine 1102 can perform packet framing/de-framing, 8-bit to 10-bit encoding/decoding, and packet scrambling/de-scrambling. Physical interface engine 1102 can then transfer this TLP information to command registers 1103. Command registers 1103 can include registers for storing the command word signature, TAG, data unit length, sub-command operation code, logical block address, and data transfer length.

Memory Write Request

In one embodiment, when a flash memory write is desired, host controller 1003 can send flash controller 1004 the memory request packet including the write command. Then host controller 1003 can send flash controller 1004 the second memory request packet including the actual data payload to write to flash memory.

A processor 1120 in flash controller 1100 transfers the logical block address in command registers 1103 to the index of a LUT 1140, which can translate the logical block address in the command word setting to a physical address on one of flash memory modules 1006 (e.g. using a translation algorithm as determined by firmware).

Once the command packet is received by processor 1120, flash memory interface controller 1150 is triggered to issue a write command on control bus 1007 as well as the data to be written on I/O bus 1008 to the flash memory module containing the physical address. This write operation sequence can conform to the flash memory specification. This process repeats itself until the sector number value in data transfer length register (see command registers 1103) is decremented to zero (note that the first memory request packet can include the data transfer length in field 707).

After each sector write operation is complete, as indicated by a status signal from the flash memory module to flash memory interface controller 1150, processor 1120 can generate a message packet (see FIG. 5) indicating the result of the write operation and transmit this message packet through physical interface engine 1102 and analog end 1101 to host controller 1003 (via ExpressCard interfaces 1005). This message packet is then passed to the device driver in host 1001.

Memory Read Request

In one embodiment, when a flash memory read is desired, host controller 1003 can send flash controller 1004 the memory request packet with the read command. A processor 1120 in flash controller 1004 transfers the logical block address in register 1104 to the index of LUT 1140, which can translate this logical block address to a physical address on one of flash memory modules 1006.

Once the command packet is received by processor 1120, flash memory interface controller 1150 is triggered to issue a flash sector read command sequence on control bus 1007 to the flash memory module containing the physical address. After each sector read operation is complete, as indicated by a status signal from the flash memory module to flash memory interface controller 1150, the transfer length decrements by one and the process repeats until a counter storing this transfer length value reaches zero. After one or more sectors have been read, processor 1120 can generate a completion packet including the read data as the data payload. This completion packet is then transmitted through physical interface engine 1102 and analog end 1101 to host controller 1003 (via ExpressCard interfaces 1005). This completion packet is then passed to the device driver in host 1001.

Other Requests/Functions

In one embodiment, when a direct memory access (DMA) is desired, DMA engine registers 1104 can be used. The values stored in DMA engine registers 1104 are described in reference to FIGS. 7, 12A, and 12B.

In another embodiment, when a read/write attribute register function is desired, an address decode 1130 can decode the address provided by processor 1120 and select the appropriate attribute register 1160.

In one embodiment, processor 1120 can perform other management functions associated with flash memory modules 1006, e.g. monitoring wear leveling (note that flash memory modules 1006 can be written to only a predetermined number of times) and avoiding bad blocks. In one embodiment, information regarding such management functions can be stored in a read-only-memory (ROM) 1141 while flash device 1002 is in operation. The integrity of the flash is maintained by keeping a wear count for each smallest erasable unit defined as a physical block in its associated spare area. Bad block management is performed on a per module basis. Therefore, in one embodiment, a bad block map can be stored at the beginning of each flash memory module.

ECC unit 1143 can perform on-the-fly calculation for error detection and correction for data stored in a sector buffer 1142. Sector buffer 1142 can store data from flash read/write transactions.

In one embodiment, flash controller 1100 can provide one or more of the following features:

a dual channel handling logic for connecting to at least two flash memory chips that has two separate buses;

a concurrency unit for connecting to at least two flash memory chips that shares the same bus;

a copy back cache logic and a cache memory buffer;

a write buffer logic and a write buffer; and a write-protected logic for preventing writing data to flash memory modules 1006.

In another embodiment, flash controller 1100 can further include a power management unit that provides a suspend mode and a sleep mode. In the suspend mode, the flash device can be idle for a specified period of time, but a clock to PLL circuitry can still be running. In the sleep mode, the flash device can be idle for another (or the same) specified period of time, but the clock to the PLL circuitry can be shut off.

In one embodiment, flash controller 1100 can further include a general purpose IO 1144, controlled by processor 1120, for generating various control signals for activity monitor purposes. For example, this general purpose IO 1144 could be connected to LED lights on the printed circuit board (e.g. one LED on the top and the other LED on the bottom) to emit variable visible light patterns indicative of operation status.

Figure 11B:
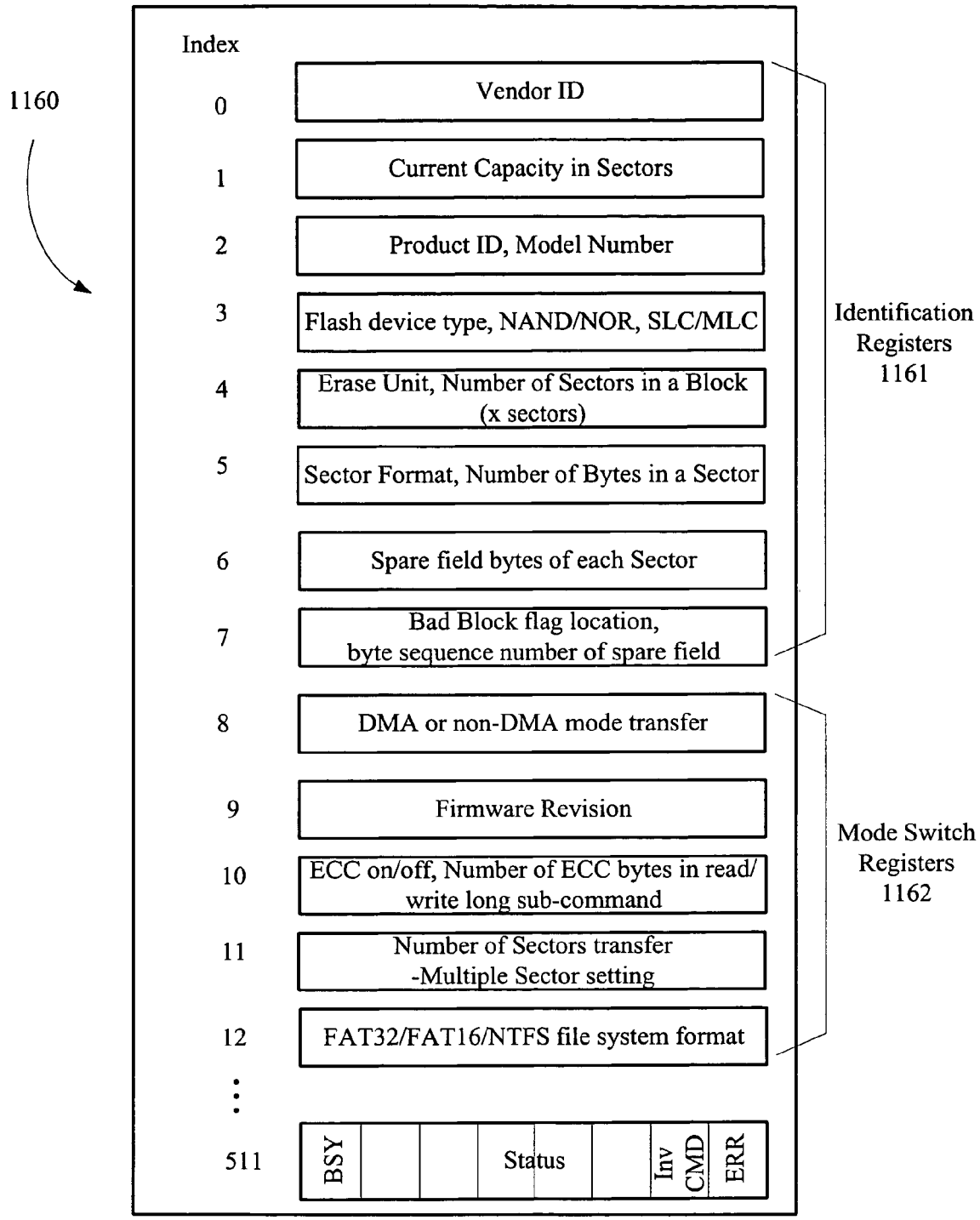
FIG. 11B illustrates a partial set of attribute registers.

FIG. 11B illustrates a partial set of attribute registers 1160. In one embodiment, the set can have 512 entries, wherein each entry occupies 8 bits (1 byte). As discussed above, attribute registers can be accessible through attribute read/write sub-commands. Note that the inquiry sub-command can also read predetermined registers in this set. Exemplary attribute registers 0-12 and 511 can be used as follows:

Attribute register 0 can indicate the vendor ID as specified by ACSI codes. Attribute register 1 can indicate capacity, i.e. the logical volume (measured in sectors) of the device that the host may use. Note that reserve space is not known to the host, but is under management of local device processor. Attribute register 2 can indicate the product ID as specified by ACSI codes. Attribute register 3 can indicate the type of flash device (e.g. NAND/NOR type flash, or Single Level Cell (SLC)/Multi-Level Cell (MLC)). Attribute register 4 can be used during an erase operation to identify (each time) how many sectors will be erased simultaneously.

Attribute register 5 can indicate a firmware decision relating to the number of sectors in a block and the number of bytes in a sector. Note that a "small format" flash can have 512 bytes per sector compared to a "big format" flash that has 2112 bytes per sector. Attribute register 6 can indicate the number of bytes of a spare field. In one embodiment, 16 bytes per small format or 64 bytes per large format can form the spare field. Attribute register 6 can indicate a bad block location.

In one embodiment, attribute registers 0-7, i.e. identification registers 1161, can be loaded before shipping to users. In contrast, attribute registers 8-511, i.e. mode switch registers 1162, can be loaded on an as-needed basis during operation of the flash device. For example, attribute register 8 can indicate whether a DMA mode is activated (described in reference to FIGS. 12A and 12B). Attribute register 9 can indicate the firmware revision. Attribute register 10 can indicate whether the ECC is on and the number of bytes in a read/write long sub-command (wherein the ECC may have different settings for error correction and detection for supporting various algorithm of data consistency checking). Attribute register 11 can indicate the number of sectors involved in transfer for read/write multiple sub-commands. Attribute register 12 can indicate file system format (e.g. FAT32, FAT16, or NTFS) used in the operating system. In one embodiment, the dedicated file format will assign file cluster size and file structures when the flash device is formatted. Note that each file system format can lead to compatibility issues. Attribute register 511 can indicate the current status report setting (wherein the current status report setting can also be encoded in the header).

As described above, attribute registers 1160 can be accessed by providing an offset and the number of registers to be read/written.

DMA Operations

A direct memory access (DMA) is a data transfer technique that can move data directly between the host and flash device. A. DMA write operation refers to writing data into the flash memory, wherein the source data is from the host. A DMA read operation refers to writing data into the host memory, wherein the source data is from the flash device. In accordance with one aspect of the invention and described, after setting a DMA bit in the attribute register of the flash device, a subsequent sub-command (e.g. write or read) can trigger the DMA operation involving the flash device.

Figure 12B:
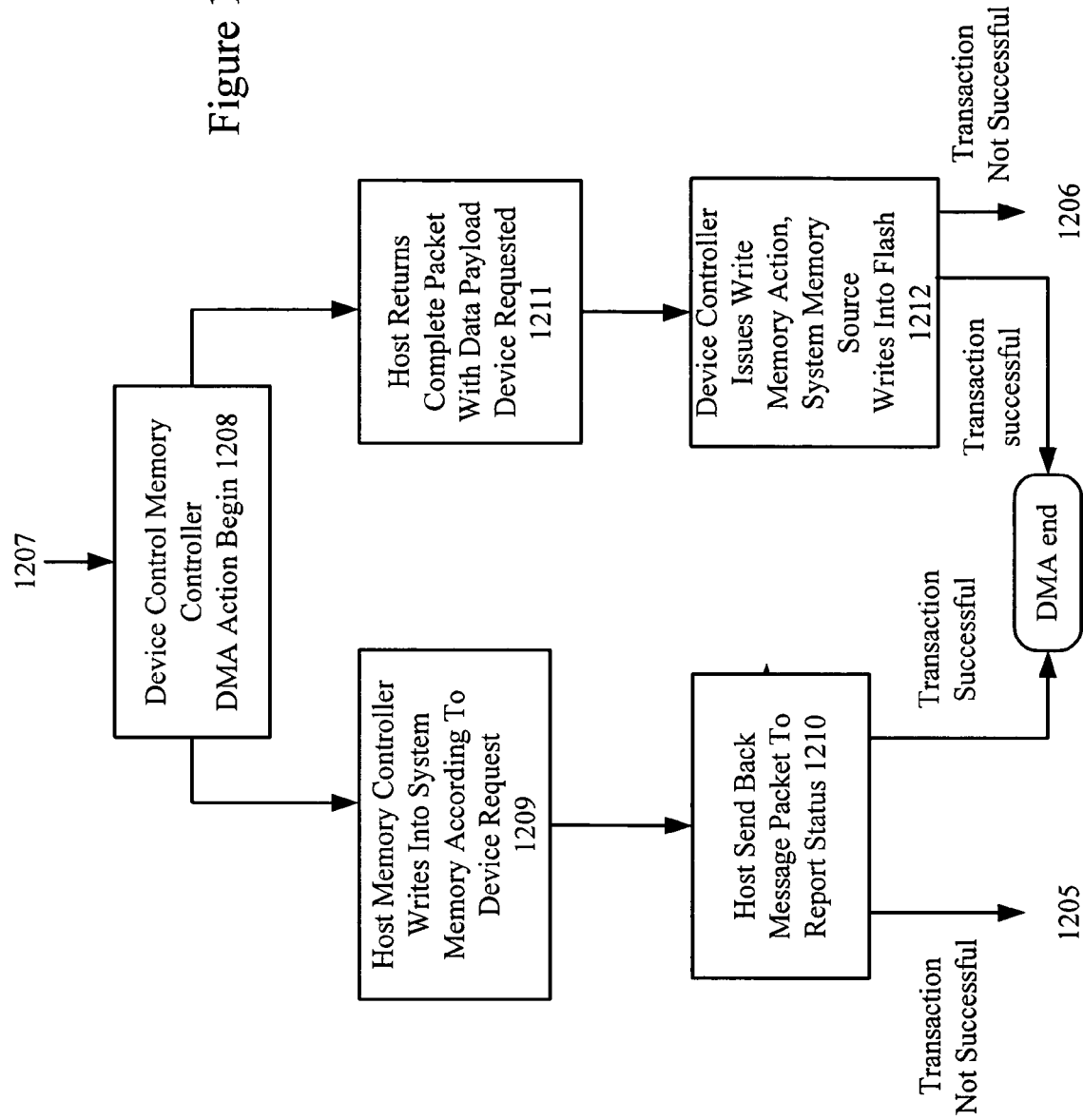

Specifically, FIGS. 12A and 12B illustrate an exemplary DMA operation that can be performed with a flash memory.

In step 1201, a host determines that a DMA operation is appropriate. In step 1202, the host can set up the DMA transfer mode by setting a DMA bit in an attribute register of the flash device (e.g. using the memory request TLP shown in FIG. 9B for an attribute register write operation). In step 1203, the host can then send a command to the flash device using a memory request TLP. This command can specify a memory-write or a memory-read operation (as well as starting address, volume, etc.).

If the command specifies a memory-read operation (as determined in step 1204), then the LBA field 706 indicates the target address the flash device will read from and data transfer length field 707 indicates how much data will be read. Moreover, because this is a DMA operation, fields 708-711 provide the flash device with the information necessary to effectively "write" to the host.

Specifically, once the command memory request TLP is received, the flash device can respond by sending a memory request TLP to the host specifying a memory-write operation in step 1205. This memory-write TLP can include the requested data payload. After receiving this memory-write TLP in step 1207, a bus controller in the host can release bus control, thereby allowing the requested DMA action to begin in step 1208.

In this case, the host controller writes the data payload into the system memory according to the memory-write TLP in step 1209. Note that this memory-write TLP can advantageously include the DMA buffer offset in address field 305 and the DMA transfer count in the length field of header 201. In step 1210, the host can send a message TLP back to the flash device to report the DMA status. If the DMA was successful, then the DMA ends. Otherwise, the process returns to step 1205, i.e. the flash device re-specifying a memory-write operation.

If the command sent in step 1203 specifies a memory-write operation (as determined in step 1204), then LBA field 706 indicates the target address the flash device will write to and data transfer length field 707 indicates how much data will be written. Moreover, because this is a DMA operation, fields 708-711 provide the flash device with the information necessary to effectively "read" from the host.

Specifically, once the command memory request TLP is received, the flash device can respond by sending a memory request TLP to the host specifying a memory-read operation in step 1206. Note that this memory-read TLP can advantageously include the DMA buffer offset in address field 305 and the DMA transfer count in the length field of header 201. After receiving this memory-read TLP in step 1207, a bus controller in the host can release bus control, thereby allowing the requested DMA action to begin in step 1208.

In this case, the host controller retrieves the requested data according to the memory-read TLP and sends the flash device a completion TLP with a data payload in step 1211. In step 1212, the controller in the flash device issues a write action and allows the data from the host to be written into the flash memory. If the DMA was successful, then the DMA ends. Otherwise, the process returns to step 1206, i.e. the flash device re-specifying a memory-read operation.

OTHER EMBODIMENTS

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, although flash memory provided in a PCI Express mass storage device is described, a flash memory controller can also be used with other mass storage devices, e.g. a USB flash hard drive, an IDE flash hard drive, an Ethernet flash hard drive, and a Serial ATA flash hard drive. Furthermore, although a PCI Express serial bus is described, the flash memory controller can also be used with other serial buses, e.g. a USB bus, an IEEE 1394 bus, and an Ethernet bus. Additionally, although a PCI Express system is described, the interface can be equally applied to other systems, e.g. a modem with an internal or external interface as well as a server machine.

Note that as used herein, the term "host" can include, but is not limited to, a personal computer (PC) having an operating system such as DOS™, Windows™, OS/2™, or Linux; a Macintosh computer; a computer having JAVA™ having OS as the operating system; and graphical workstations such as the computers of Sun Microsystems and Silicon Graphics, and other computers having some version of the UNIX operating system such as AIX™ or SOLARIS™ of Sun Microsystems; or any other known and available operating system, including operating systems such as Windows CE™ for embedded systems, including cellular telephones, handheld computational devices and palmtop computational devices, and any other computational device which can be connected to a network.

In one embodiment, the flash controller can advantageously divide a transaction from the host that is too long and then request the host to resend the portion of the transaction that was ignored by the flash controller.

The flash memory controller of the present invention can perform multiple-block data access. The conventional flash memory device has a 512-byte page register built-in. The data write to the flash memory device has to write to the page register first and then to a flash memory cell. The conventional flash memory controller, as well as its built-in firmware, controls the flash memory access cycles. The conventional flash memory controller transfers one single block (512 bytes) of data to the page register of the flash memory device at a time. No other access to the flash memory is allowed once the 512 bytes page register is filled. Consequently, the conventional flash memory controller, which uses the single-block data access methodology, limits the performance of flash memory devices.

In accordance with the present invention, the flash memory controller utilizes a 2K or larger size page register. The flash memory controller of the present invention functions as a multiple-block access controller by sending multiple blocks of data simultaneously to a flash memory to fill up the page register. This significantly improves the performance of the data transfer. Compared to the conventional single-block data-transfer controller, which transfers a single block at a time, the data transfer performance using the flash memory controller of the present invention is significantly improved.

The flash memory controller of the present invention can also provide dual channel processing to improve performance of the flash memory system. Dual channeling provides a second channel, or "freeway," for executing transactions between the flash memory controller and the flash memory device. A conventional flash memory controller uses a single memory bus such that one or more flash memory devices attached to it. However, the conventional architecture limits the performance of the conventional flash memory controller.

In accordance with the present invention, at least two sets of memory buses are utilized. Each set of memory buses is coupled to separate flash memory devices. The memory controller can access flash memory devices together or separately. As a result, transactions can be executed twice as fast utilizing dual channel processing. Furthermore, each memory bus can also be further expanded to multiple sets of memory buses.

The flash memory controller of the present invention can also interleave operations. A conventional flash memory controller uses a single set of memory buses such that one or more flash memory devices are attached to it. However, the conventional flash memory controller can only access the flash memory devices one at a time. Accordingly, the conventional architecture limits the performance of the conventional flash memory controller.

In accordance with the present invention, at least one or two extra sets of memory control signals (such as separate Chip Enable and Busy signals) are utilized. Furthermore, a shared memory bus having at least two banks of flash memory devices are attached to the shared memory bus. The flash memory controller of the present invention can access one bank of flash memory devices while the other bank is busy reading or writing. Accordingly, the flash memory controller of the present invention fully utilizes the shared memory bus and thus significantly increases the performance. Furthermore, the number of pins of the flash memory controller is reduced by sharing memory IO and control signals. This minimizes the cost to make flash memory devices.

In accordance with the present invention, one in the art can integrate functions of multiple block access, multiple bank interleaving, and multiple channel operations together in a memory access cycle of a single chip to achieve maximum performance.

In accordance with the present invention, the flash memory controller can be applied to ExpressCard systems. Also, the flash memory controller can be applied to other embodiments involving multi-mode USB, Secure Digital (SD), MultiMediaCard (MMC), Memory Stick (MS), and Compact Flash (CF).

In accordance with the present invention, the flash memory controller also supports Single Level Cell (SLC), Multiple Level Cell (MLC) type of flash memory.

Accordingly, it is intended that the scope of the invention be defined by the following Claims and their equivalents.

The invention claimed is:

1. A method of performing an operation on a flash device, the operation being requested by a host separate from the flash device, the operation being PCI Express-compatible, the method comprising:
    sending a first memory request from the host to the flash device, wherein the first memory request includes a command word setting in a header,
    wherein the command word setting indicates the operation to be performed on the flash device, and
    wherein the first memory request further includes memory mapped I/O addresses in the header, the memory mapped I/O addresses comprising a command word port and a data value port.

2. The method of claim 1, wherein if the first memory request is a flash memory write operation, then further including:
    sending a second memory request from the host to the flash device, wherein the second memory request includes a header and a data payload, wherein the data payload includes data to be written to the flash device.

3. The method of claim 2, after receiving the second memory request, further including:
    sending a message packet from the flash device to the host, wherein the message packet includes a header and a digest to report on a completion status of the write operation.

4. The method of claim 1, wherein if the first memory request is a flash memory erase operation, then further including:
    sending a second memory request from the host to the flash device, wherein the second memory request includes a header and a dummy data payload, wherein the dummy data payload includes dummy data to be written to the flash device.

5. The method of claim 4, after receiving the second memory request, further including:
    sending a message packet from the flash device to the host, wherein the message packet includes a header and a digest to report on a completion status of the write operation.

6. The method of claim 1, wherein if the first memory request is a register write operation, then further including:
    sending a second memory request from the host to the flash device, wherein the second memory request includes a header and a data payload, wherein the data payload includes data to be written to a register in the flash device.

7. The method of claim 6, after receiving the second memory request, further including:
    sending a message packet from the flash device to the host, wherein the message packet includes a header and a digest to report on a completion status of the write operation.

8. The method of claim 1, wherein if the first memory request is a memory read operation, then further including:
    sending a second memory request from the host to the flash device, wherein the second memory request includes a header and a digest, but no data payload.

9. The method of claim 8, after receiving the second memory request, further including:
    sending a completion packet from the flash device to the host if the read operation is successful, wherein the completion packet includes a header, data from the flash memory, and a digest; and
    sending a message packet from the flash device to the host if the read operation is not successful, wherein the message packet includes a header and a digest to report on a completion status of the read operation.

10. The method of claim 1, wherein if the first memory request is a status register read operation, then further including:
    sending a second memory request from the host to the flash device, wherein the second memory request includes a header and a digest, but no data payload.

11. The method of claim 10, after receiving the second memory request, further including:
    sending a completion packet from the flash device to the host, wherein the completion packet includes a header, data from the status register, and a digest.

12. The method of claim 1, wherein if the first memory request is a direct memory access (DMA) operation, then further including:
    sending a second memory request from the flash device to the host.

13. The method of claim 12, wherein if the DMA operation is a write, then the second memory request specifies a memory-read operation.

14. The method of claim 13, further including the host:
- releasing bus control after receiving the second memory request;
- retrieving data requested in the second memory request; and
- sending the flash device a completion packet with a data payload.

15. The method of claim 14, further including the flash device:
- issuing a write action; and
- allowing data from the host to be written into flash memory.

16. The method of claim 9, wherein if the DMA operation is a read, then the second memory request specifies a memory-write operation.

17. The method of claim 16, wherein the second memory request includes a data payload.

18. The method of claim 17, further including the host releasing bus control after receiving the second memory request.

19. The method of claim 18, further including the host writing the data payload into system memory according to the second memory request.

20. The method of claim 19, further including the host sending a message back to the flash device reporting on DMA status.

* * * * *

UNITED STATES PATENT AND TRADEMARK OFFICE
CERTIFICATE OF CORRECTION

| | | |
|---|---|---|
| PATENT NO. | : 7,457,897 B1 | Page 1 of 1 |
| APPLICATION NO. | : 10/803597 | |
| DATED | : November 25, 2008 | |
| INVENTOR(S) | : Lee et al. | |

It is certified that error appears in the above-identified patent and that said Letters Patent is hereby corrected as shown below:

On the title page, Item [73], delete "Suoer Talent Electronics, Inc.," and insert --Super Talent Electronics, Inc.--

Signed and Sealed this
Twenty-fifth Day of November, 2014

Michelle K. Lee
*Deputy Director of the United States Patent and Trademark Office*